US011487142B2

(12) United States Patent
Kim et al.

(10) Patent No.: US 11,487,142 B2
(45) Date of Patent: Nov. 1, 2022

(54) DISPLAY DEVICE WITH PATTERNED COMMON ELECTRODE

(71) Applicant: Samsung Display Co., Ltd., Yongin-si (KR)

(72) Inventors: Dong Wook Kim, Asan-si (KR); Won Kyu Kwak, Seongnam-si (KR); Jin Woo Park, Asan-si (KR); Hyun-Chol Bang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/328,555

(22) Filed: May 24, 2021

(65) Prior Publication Data

US 2021/0278729 A1 Sep. 9, 2021

Related U.S. Application Data

(63) Continuation of application No. 16/656,952, filed on Oct. 18, 2019, now Pat. No. 11,016,349.

(30) Foreign Application Priority Data

Oct. 18, 2018 (KR) .......................... 10-2018-0124393

(51) Int. Cl.
*G09G 3/36* (2006.01)
*G02F 1/133* (2006.01)
(Continued)

(52) U.S. Cl.
CPC .... *G02F 1/13318* (2013.01); *G02F 1/134336* (2013.01); *H01L 27/3216* (2013.01);
(Continued)

(58) Field of Classification Search
CPC ............ G02F 1/136286; G02F 1/1368; G09G 3/3648; G09G 2300/0814; G09G 3/12; G09G 3/30–3291
See application file for complete search history.

(56) References Cited

U.S. PATENT DOCUMENTS 7,091,936 B1 8/2006 Yamada
9,767,782 B2 9/2017 Takeda
(Continued)

FOREIGN PATENT DOCUMENTS

CN 107194321 9/2017
CN 107863448 3/2018
(Continued)

OTHER PUBLICATIONS

Extended European Search Report corresponding to European Patent Application or Patent No. 19204161.4 dated Apr. 14, 2020.
(Continued)

*Primary Examiner* — Sanghyuk Park
(74) *Attorney, Agent, or Firm* — Kile Park Reed & Houtteman PLLC

(57) ABSTRACT

A display device includes a substrate including a first display area and a second display area. The first display area includes first pixel areas, each including one or more first pixels. The second display area includes second pixel areas including one or more second pixels and a light transmittance area having a higher light transmittance than the second pixel area. The first and second display areas include a common electrode that transmits a constant common voltage. The common electrode in the second display area includes patterned regions that correspond to a first light transmittance area included in the light transmittance area. A thickness of the common electrode in the patterned regions is smaller than a thickness of the common electrode in a region other than the patterned regions or equals zero. The
(Continued)

patterned regions and the second pixel areas extend alternately along a first direction in the second display area.

17 Claims, 26 Drawing Sheets

(51) Int. Cl.
| | | |
|---|---|---|
| *G02F 1/1343* | (2006.01) | |
| *H01L 27/32* | (2006.01) | |
| *H01L 51/52* | (2006.01) | |
| *G02F 1/1368* | (2006.01) | |

(52) U.S. Cl.
CPC ...... *H01L 27/3218* (2013.01); *H01L 51/5209* (2013.01); *H01L 51/5225* (2013.01); *G02F 1/1368* (2013.01); *G02F 1/134318* (2021.01); *G02F 2201/52* (2013.01); *G09G 2300/0452* (2013.01); *H01L 27/3244* (2013.01)

(56) References Cited

U.S. PATENT DOCUMENTS

| | | | |
|---|---|---|---|
| 9,767,785 B2 | 9/2017 | Ashby et al. | |
| 9,864,400 B2 | 1/2018 | Evans et al. | |
| 10,733,931 B2 | 8/2020 | Jung et al. | |
| 11,138,927 B2 | 10/2021 | Jung et al. | |
| 2003/0052618 A1 | 3/2003 | Ishizuka | |
| 2008/0002113 A1* | 1/2008 | Abe | H01L 51/5203 349/107 |
| 2009/0279029 A1 | 11/2009 | Kunii et al. | |
| 2013/0208017 A1* | 8/2013 | Gu | G09G 3/003 345/690 |
| 2015/0144934 A1 | 5/2015 | Rappoport et al. | |
| 2016/0141353 A1 | 5/2016 | Kim et al. | |
| 2017/0213496 A1* | 7/2017 | Hsu | H01L 27/3213 |
| 2017/0227799 A1* | 8/2017 | Kawamura | G02F 1/1345 |
| 2018/0005561 A1* | 1/2018 | Moon | H01L 51/56 |
| 2018/0090695 A1 | 3/2018 | Maruyama | |
| 2018/0129328 A1 | 5/2018 | Park et al. | |
| 2019/0123306 A1 | 4/2019 | Liang et al. | |
| 2020/0019747 A1 | 1/2020 | Yang et al. | |
| 2020/0135148 A1 | 4/2020 | Bai et al. | |
| 2020/0310184 A1 | 10/2020 | Imai et al. | |
| 2022/0020321 A1 | 1/2022 | Jung et al. | |

FOREIGN PATENT DOCUMENTS

| | | |
|---|---|---|
| CN | 108269502 | 7/2018 |
| JP | 5714398 | 5/2015 |
| KR | 10-2015-0029362 | 3/2015 |
| KR | 10-2017-0113066 | 10/2017 |
| KR | 10-2018-0050473 | 5/2018 |
| KR | 10-1859105 | 5/2018 |
| KR | 10-2018-0063627 | 6/2018 |
| KR | 10-2018-0065722 | 6/2018 |
| KR | 10-2018-0072303 | 6/2018 |

OTHER PUBLICATIONS

Extended European Search Report corresponding to European Patent Application or Patent No. 19204146.5 dated Jan. 7, 2020.

* cited by examiner

PUg

PUh

DISPLAY DEVICE WITH PATTERNED COMMON ELECTRODE

CROSS-REFERENCE TO RELATED APPLICATION(S)

This is a continuation application of U.S. patent application Ser. No. 16/656,952, filed Oct. 18, 2019, the disclosure of which is incorporated herein by reference in its entirety. U.S. patent application Ser. No. 16/656,952 claims priority to and benefit of Korean Patent Application No. 10-2018-0124393 under 35 U.S.C. § 119, filed on Oct. 18, 2018 in the Korean Intellectual Property Office, the entire contents of which are incorporated herein by reference.

BACKGROUND

1. Field

Embodiments relate to a display device.

2. Description of the Related Art

A display device such as a liquid crystal display (LCD), an organic light emitting diode (OLED) display, or the like, includes a display panel that includes a plurality of pixels that can display an image. Each pixel includes a pixel electrode that receives a data signal, and the pixel electrode is connected with at least one transistor and thus receives the data signal.

Recently, various display devices having functions other than image displaying have been researched and developed.

SUMMARY

Embodiments are directed to a display device including a substrate that includes a first display area and a second display area. The first display area includes a plurality of first pixel areas. Each of the plurality of first pixel areas includes one or more first pixels. The second display area includes a plurality of second pixel areas and a light transmittance area. Each of the plurality of second pixel areas includes one or more second pixels. The light transmittance area has higher light transmittance than the second pixel area. The first display area and the second display area include a common electrode that transmits a constant common voltage. The common electrode in the second display area includes a plurality of patterned regions that correspond to a first light transmittance area included in the light transmittance area. A thickness of the common electrode in the patterned regions is smaller than a thickness of the common electrode in a region other than the patterned regions or equals zero. The plurality of patterned regions and the plurality of second pixel areas extend alternately along a first direction in the second display area.

The plurality of second pixel areas in the second display area may be distanced from each other along the first direction and a second direction that is different from the first direction. A second light transmittance area included in the light transmittance area is between two of the second pixel areas that neighbor each other, at a distance from each other.

In the second display area, the plurality of patterned regions and the plurality of second pixel areas may be alternately arranged along the second direction.

The second pixel area may include a first color pixel that represents a first color, a second color pixel that represents a second color that is different from the first color, and a third color pixel that represents a third color that is different from the first color and the second color.

The first color pixel, the second color pixel, and the third color pixel may be formed in a same shape as each other and may be arranged in a line in the second pixel area.

One of the second pixel areas may include one of the first color pixel, one of the second color pixel, and one of the third color pixel.

At least two of the first color pixel, the second color pixel, and the third color pixel may be different in size from each other.

Each of the plurality of second pixel areas may include only one pixel that represents one color.

The common electrode in the first display area may be continuously formed with a uniform thickness.

One of the patterned regions may extend long in the second direction. Two or more of the second pixel areas may be in an area that is adjacent to the patterned region in the first direction.

The second pixel area may include a first color pixel representing a first color, a second color pixel representing a second color that is different from the first color, and a third pixel representing a third color that is different from the first color and the second color.

The first color pixel, the second color pixel, and the third color pixel may be formed in a same shape as each other and arranged in a line in the second pixel area.

One of the second pixel areas may include one of the first color pixel, one of the second color pixel, and one of the third color pixel.

At least two of the first color pixel, the second color pixel, and the third color pixel may be different in size from each other.

The common electrode may not be at an outer side of one edge of the patterned region.

Embodiments are also directed to a display device including a substrate that includes a first display area and a second display area, a plurality of first pixel areas that are in the first display area, a plurality of second pixel areas and a light transmittance area that are in the second display area, a plurality of pixel electrodes that are in the first pixel area and the second pixel area, an emission layer that is on the plurality of pixel electrodes, and a common electrode that is on the emission layer of the first pixel area and the second pixel area and configured to transmit a common voltage. The common electrode in the second display area may include a plurality of patterned regions that correspond to the light transmittance area. A thickness of the common electrode in the patterned regions may be smaller than a thickness of the common electrode in a region other than the patterned regions or equals zero.

In the second display area, the plurality of patterned regions and the plurality of second pixel areas may be alternately arranged along a first direction.

The plurality of second pixel areas in the second display area may be distanced from each other in the first direction and a second direction that is different from the first direction. The light transmittance area may be between two of the second pixel areas that neighbor each other at a distance from each other.

Embodiments are also directed to a display device including a substrate that includes a first display area and a second display area, a plurality of first pixel areas that are in the first display area, a plurality of second pixel areas and a light transmittance area that are in the second display area, and a common electrode that is in the first pixel area and in the second pixel area and configured to transmit a common voltage. The light transmittance area may have higher light transmittance than the second pixel area. Each of the plurality of second pixel areas may include a plurality of second pixels that extend in a first direction. The common electrode in the second display area may include a plurality of patterned regions that correspond to a first light transmittance area included in the light transmittance area. A thickness of the common electrode in the patterned region may be smaller than a thickness of the common electrode in a region other than the patterned regions or equals zero. Each of the plurality of patterns may extend in a second direction that is different from the first direction.

The plurality of second pixel areas in the second display area may be distanced from each other in the second direction. A second light transmittance area included in the light transmittance area may be between two of the second pixel areas that neighbor each other at a distance from each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
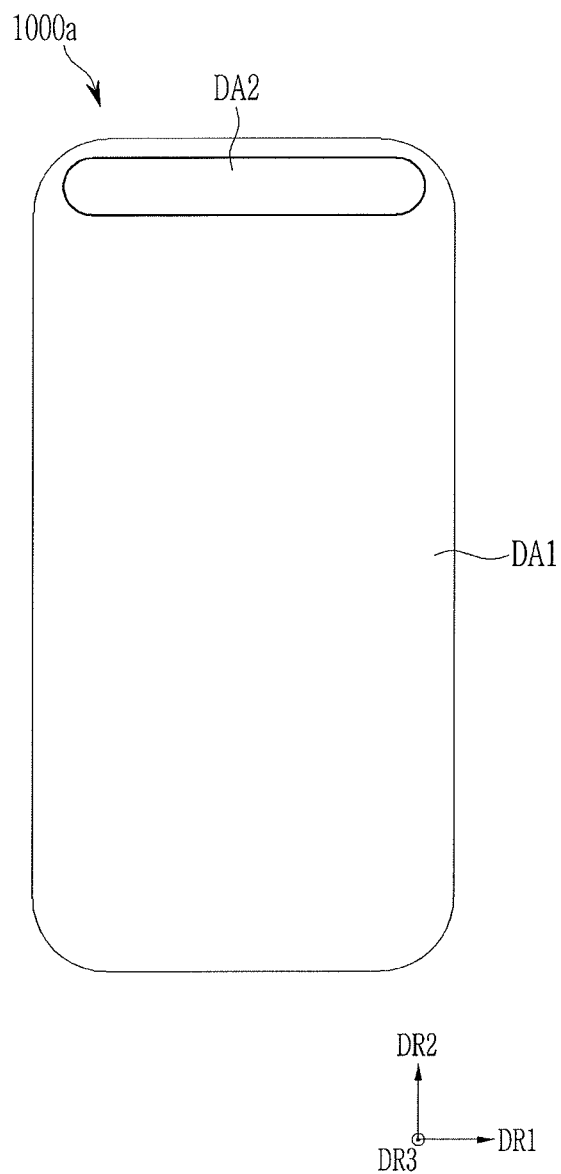
FIG. 1, FIG. 2, and FIG. 3 illustrate schematic layout views of display areas of display devices according to the respective exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, the word "on" with respect to a target element will be understood to mean positioned above or below the target element, and is not necessarily meant to be understood as positioned only "at an upper side" based on an opposite direction to gravity.

Throughout the specification, the expression, "in a plan view" implies a view observing a plane that is parallel with two directions that cross each other (e.g., a first direction DR1 and a second direction DR2), and the expression, "in a cross-sectional view" implies a view observing a plane cut in a direction that is perpendicular to the plane that is parallel with the first direction DR1 and the second direction DR2. In addition, when two constituent elements overlap, it implies that the two constituent elements overlap in a third direction DR3 (e.g., a direction that is perpendicular to a top surface of a substrate) unless otherwise stated.

Figure 2:
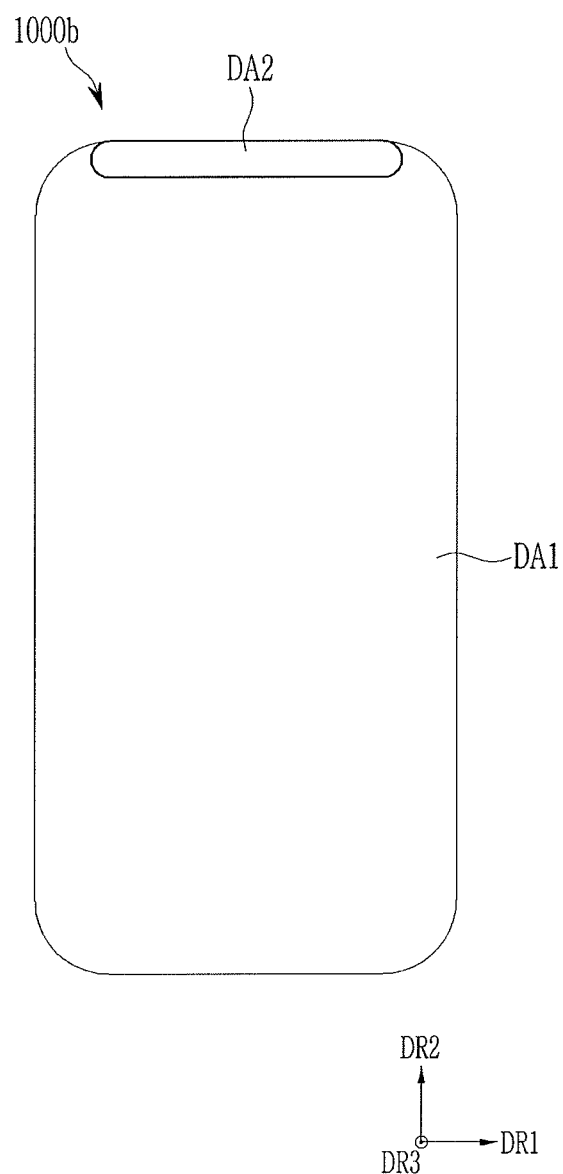
Figure 3:
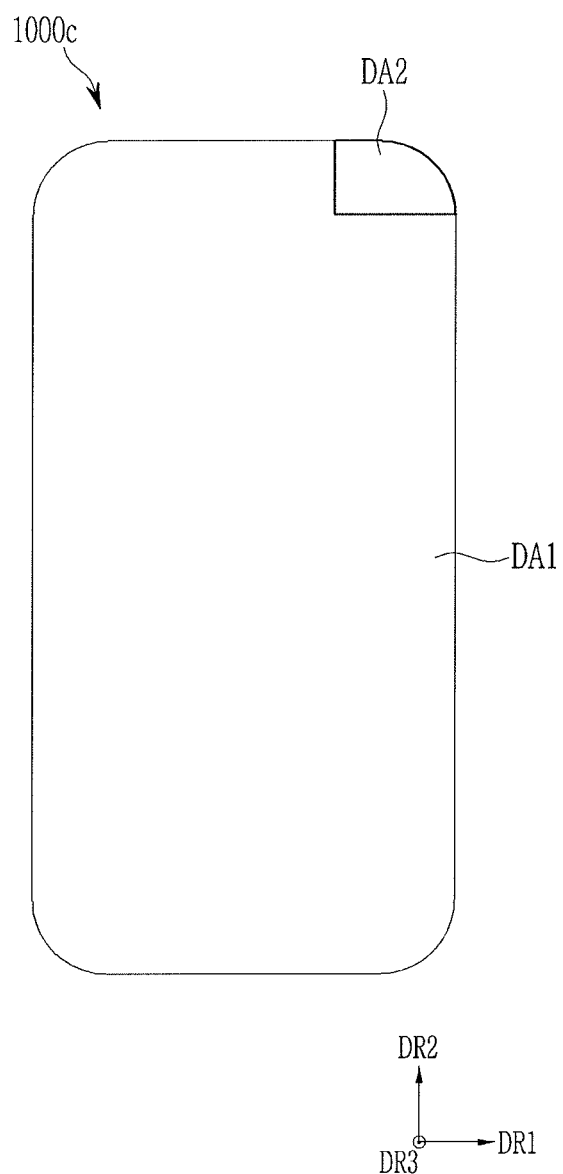

Hereinafter, structures of display devices according to exemplary embodiments will be described with reference to FIG. 1 to FIG. 4. FIG. 1, FIG. 2, and FIG. 3 illustrate schematic layout views of display areas of display devices according to respective exemplary embodiments, and FIG. 4 illustrates a schematic cross-sectional view of a display device according to an exemplary embodiment.

Referring to FIG. 1 to FIG. 4, display areas included in display devices 1000, 1000a, 1000b, and 1000c according to the respective exemplary embodiments are areas where an image can be displayed. Each of the display areas may include a first display area DA1 and a second display area DA2, which can display an image and may also have another function.

A greater amount of light having a wavelength that is different from a wavelength of light of a displayed image may be incident on or emitted from the second display area DA2 than in the first display area DA1.

Figure 4:
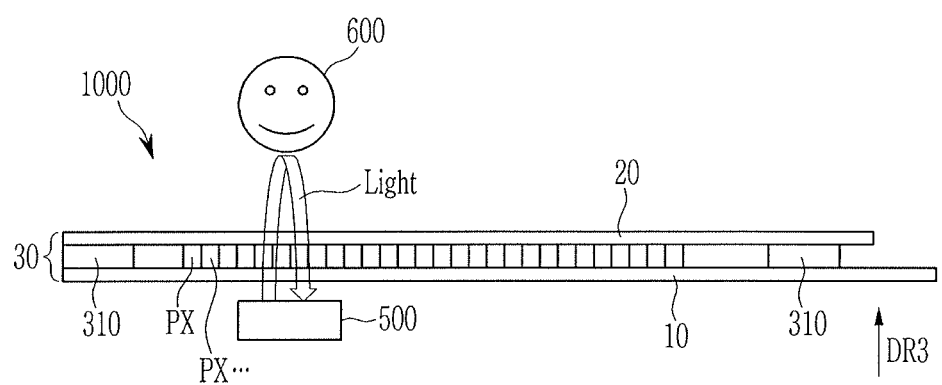
FIG. 4 illustrates a schematic cross-sectional view of a display device according to an exemplary embodiment.

For example, referring to FIG. 4, a display device 1000 according to an exemplary embodiment may include a display panel 30 and an optical member 500 that is behind the display panel 30. Light of a wavelength used by the optical member 500 may pass through the second display area DA2 with higher light transmittance compared to that of the first display area DA1.

In the second display area DA2, a ratio of an area where an image can be displayed, that is, an area occupied by pixels, may be smaller than a ratio of an area occupied by pixels in the first display area DA1.

The second display area DA2 may include a pixel area and a light transmittance area. The light transmittance area may have a higher light transmittance than the pixel area. When no pixel is in the light transmittance area, light of a desired image cannot be displayed. Here, the term "pixel" may refer to a unit area where light of an image is emitted.

Referring to FIG. 1, the second display area DA2 may be surrounded by the first display area DA1 and may be located at the periphery of one side of the display device 1000a in a plan view. For example, in a plan view, a portion of the first display area DA1 may be disposed between the second display area DA2 and an edge of the display device 1000a. For example, the second display area DA2 may be disposed near the upper end of the display device 1000a and may be formed in the shape of a plane that extends in a first direction DR1 along most of the upper edge of the display device 1000a.

Referring to FIG. 2, a second display area DA2 according to the present exemplary embodiment may be almost the same as the second display area DA2 shown in FIG. 1, except that a first display area DA1 may not be disposed at the periphery of at least one side of the second display area DA2. For example, in a plan view, one edge of the second display area DA2 may match one edge of the display device 1000b. For example, when the second display area DA2 is located near an upper edge of the display device 1000b, the first display area DA1 may not be disposed in an upper side of the second display area DA2.

Referring to FIG. 3, a second display area DA2 according to the present exemplary embodiment may be almost the same as the second display area DA2 shown in FIG. 2, except that the second display area DA2 may be located adjacent to a corner or near the corner of a display device 1000c. In a plan view, one edge of the second display area DA2 may match one corner of the display device 1000c. For example, when the second display area DA2 is located near an upper corner of the display device 1000c, one edge of the second display area DA2 may match one edge of one upper corner of the first display area DA1.

In some implementations, the second display area DA2 may be disposed at various locations in the display area of the display device with various planar shapes. As examples, the second display area DA2 may have a circular planar shape located near an upper edge of the display area.

Referring to FIG. 4, the display panel 30 of the display device 1000 may include a substrate 10 disposed in the above-described first area DA1 and second area DA2. For example, the substrate 10 may be continuously formed in the second display area DA2 and no removed portion may exist.

A plurality of pixels PX may be formed between the substrate 10 and an encapsulation substrate 20. A sealant 310 that is disposed between the substrate 10 and the substrate 20 may be further located at an edge of the display panel 30. An optical member 500 may be disposed below the display panel 30. The optical member 500 may be, for example, a camera, a flash, a sensor, or the like.

The optical member 500 may emit light of a constant wavelength length toward an object 600 that is located on the display panel 30 or may receive light reflected by the object 600. Light of such a constant wavelength can be processed by the optical member 500. The light may be light of a wavelength other than a visible light region, which is light of an image displayed on the pixel PX. The light of the constant wavelength may substantially pass through the light transmittance area located in the second display area DA2. When the optical member 500 an infrared camera, light of the given wavelength may be infrared light, for example, of about 900 nm to 1000 nm.

The optical member 500 may correspond to the entire area of the second display area DA2 in a plan view or may only correspond to only some of the second display area DA2. For example, the optical member 500 may be disposed to correspond to some of the second display area DA2 shown in FIG. 1.

A first display area DA1 and a second display area DA2 of a display device according to exemplary embodiments will be described with reference to FIG. 5 to FIG. 20, together with the above-described drawings.

FIG. 5 to FIG. 12 are layout views of a first display area DA1 and a second display area DA2 of a display device according to each of the respective exemplary embodiments FIG. 13 to FIG. 20 show a pixel area of a display device according to each of the respective exemplary embodiments.

A first display area DA1 may include a plurality of pixel areas PU1. A second display area DA2 may include a plurality of pixel areas PU2 and a light transmittance area TA.

In the first display area DA1, the plurality of pixel areas PU1 may be arranged, for example, in a matrix format in which a first direction DR1 and a second direction DR2 or two diagonal directions that cross each other are rows and columns. In the second display area DA2, the plurality of pixel areas PU2 and the light transmittance areas TA may be arranged, for example, in a matrix format. Herein, the term "diagonal direction" refers to a direction that crosses both of the first direction DR1 and the second direction DR2.

Each of the pixel areas PU1 and PU2 may include a plurality of pixels or a single pixel. A structure of the pixel area PU1 and a structure of the pixel area PU2 may be equal to or different from each other. Two neighboring pixel areas PU1 in the first display area DA1 may have the same or different structures, and two neighboring pixel areas PU2 in the second display area DA2 may have the same or different structures. For example, two pixel areas PU1 that neighbor each other in a row or column direction in the first display area DA1 may have structures that are symmetrical to each other, and two pixels PU2 that neighbor each other in a row or column direction in the second display area DA2 may have structures that are symmetrical to each other.

FIG. 13 to FIG. 20 respectively illustrate the respective pixel areas PU1 and PU2.

Referring to FIG. 13 to FIG. 18, each pixel area PU1 and/or pixel area PU2 may include a plurality of pixels, each outputting a different color. The plurality of pixels included in each of the pixel areas PU1 and PU2 may output three primary colors of red, green, and blue or four primary colors, or may output cyan, magenta, yellow, and/or white. For example, each pixel area PU1 and/or pixel area PU2 may include a red pixel R, a green pixel G, and a blue pixel B.

FIG. 13 to FIG. 15 and FIG. 17 illustrate examples in which each pixel area PU1 and/or pixel area PU2 includes one red pixel R, one green pixel G, and one blue pixel B.

Figure 13:
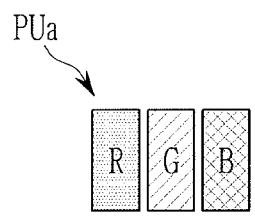
FIG. 13 to FIG. 20 illustrate a pixel area of a display device according to each of the respective exemplary embodiments.

In an exemplary embodiment shown in FIG. 13, pixels R, G, and B included in one pixel area PUa may have the same shape such as, e.g., a rectangle, and may be arranged in one direction.

Figure 14:
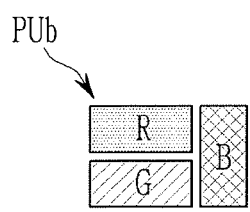

In an exemplary embodiment shown in FIG. 14, pixels R, G, and B included in one pixel area PUb may respectively have substantially rectangular shapes. Two among the three pixels R, G, and B, for example, a red pixel R and a green pixel G, may be arranged vertically neighboring each other, and the remaining one, which is a green pixel G, may be arranged in a vertical direction at one side of the red pixel R and the green pixel G. The red pixel R and the green pixel G may respectively extend in a horizontal direction.

Figure 15:
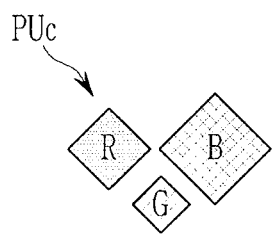

In an exemplary embodiment shown in FIG. 15, pixels R, G, and B included in one pixel area PUc may respectively have substantially rhombus shapes. The red pixel R, the green pixel G, and the blue pixel B may be different from each other in size. For example, the blue pixel B may be the largest and the green pixel G may be the smallest.

Figure 16:
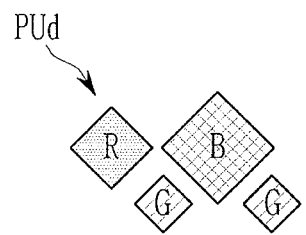

FIG. 16 shows an example in which a pixel area PU1 and/or a pixel area PU2 includes one red pixel R, one blue pixel B, and two green pixels G. Each of the pixels R, G, and B included in each pixel area PUd may substantially have a rhombus shape. The red pixel R, the green pixels G, and the blue pixel B may be different from each other in size. For example, the blue pixel B may be the largest and the green pixels G may be the smallest.

Figure 17:
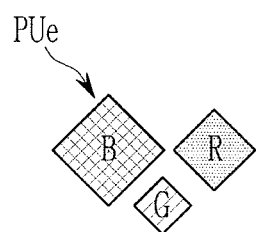
Figure 18:
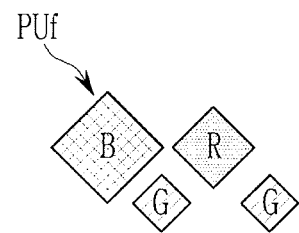

Exemplary embodiments of FIG. 17 and FIG. 18 are almost the same as the exemplary embodiments of FIG. 15 and FIG. 16, respectively, except that locations of a red pixel R and a blue pixel B included in one pixel area PUe and PUf may be opposite to the locations of the red pixel R and the blue pixel B in the pixel areas PUc and PUd shown in FIG. 15 and FIG. 16.

Figure 19:
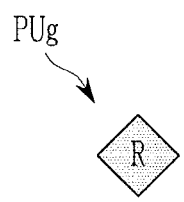
Figure 20:
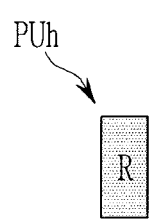

Referring to FIG. 19 and FIG. 20, each pixel area PU1 and/or pixel area PU2 may include only one pixel that represents the same color. For example, FIG. 19 and FIG. 20 exemplarily illustrate that one of pixel areas PUg and PUh includes only a red pixel R, but this is not restrictive. Each of the pixel areas Pug and PUh may include only a green pixel G or only a blue pixel B. In this case, a second display area DA2 can display one single color among red, green, and blue.

Referring to FIG. 19, a pixel R included in one pixel area PUg may be substantially formed in the shape of a rhombus.

Referring to FIG. 20, a pixel R included in one pixel area PUh may be substantially formed in the shape of a rectangle.

In the exemplary embodiments shown in FIG. 13 to FIG. 20, the order, the arrangement, and the number the red pixel R, the green pixel G, and the blue pixel B shown in the drawings, and the order, arrangement, and colors can be variously changed. For example, in the exemplary embodiment shown in FIG. 16, the red pixel R, the green pixel G, the blue pixel B, and the green pixel G are illustrated in such an order, but they may be arranged in an order of the red pixel R, the blue pixel B, the green pixel G, and the blue pixel B.

Figure 5:
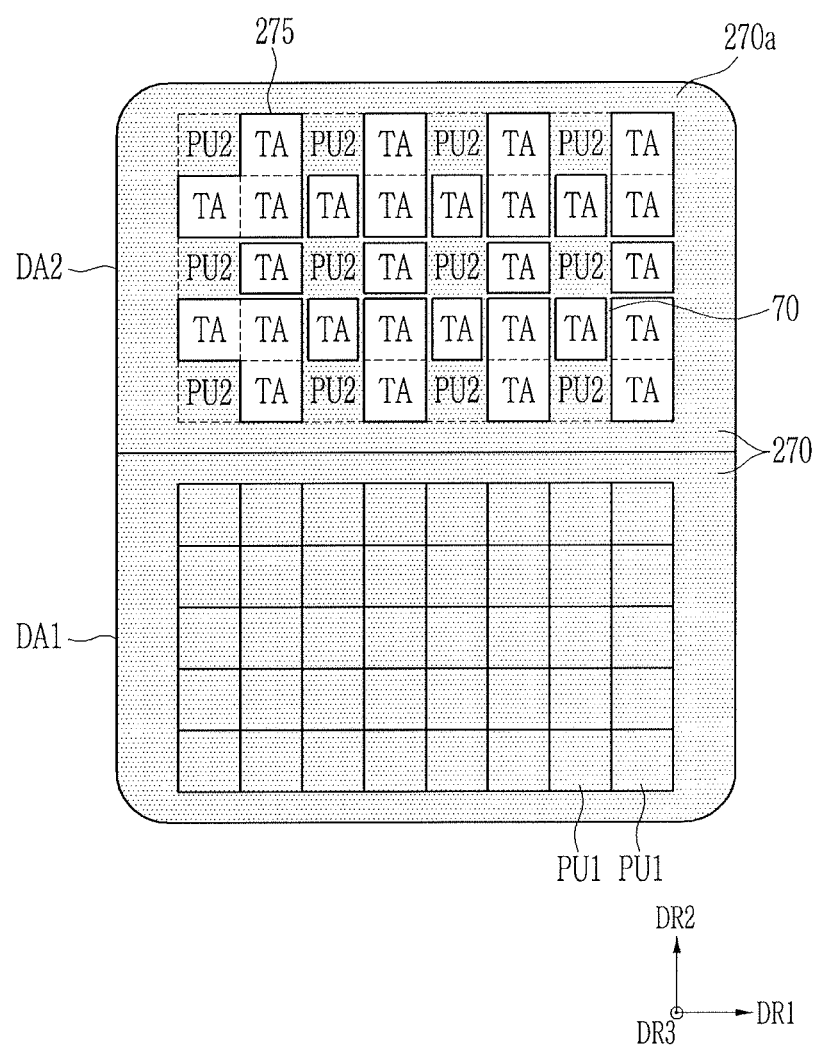
FIG. 5 to FIG. 12 illustrate layout views of a first display area DA1 and a second display area DA2 of a display device according to each of the respective exemplary embodiments.

Referring to FIG. 5, in the second display area DA2, the light transmittance area TA may be disposed between two pixels PU2 that are adjacent to each other in the first direction DR1, the second direction DR2, and the diagonal direction. For example, the pixel areas PU2 and the light transmittance areas TA may be alternately arranged in the first direction DR1, in the second direction DR2, and in the diagonal direction.

As previously described, the light transmittance area TA has higher light transmittance than the pixel area PU2. A pixel, which is an image display unit that can emit light to display an image, may not be formed in the light transmittance area TA.

In the second display area DA2, the area of each of the light transmittance areas TA between two pixels PU2 adjacent in the first direction DR1 and the second direction DR2 may be the same as, similar to, or different from the area of one pixel area PU2. In some implementations, the area of the light transmittance area TA may vary rather than being constant. One light transmittance area TA having an area that corresponds to one pixel area PU2 may be referred to as a "unit light transmittance area TA."

In the display device according to the exemplary embodiment, common electrodes 270 may be in the first display area DA1 and the second display area DA2. The common electrode 270 in the first display area DA1 and the common electrode 270 in the second display area DA2 may be connected with each other as one electrode and may transmit a constant common voltage.

The common electrode 270 in the first display area DA1 may be continuously formed as a single electrode without having a cutout, an opening, a pattern, or the like. For example, the common electrode 270 disposed in the first display area DA1 may have a substantially uniform thickness.

The common electrode 270 disposed in the second display area DA2 may have a plurality of patterned regions 275. In a plan view, the plurality of patterned regions 275 may correspond to at least a part of the light transmittance areas TA. The common electrode 270 other than in the patterned regions 275 may be in the pixel areas PU2. In a plan view, the patterned regions 275 of the common electrode 270 may have a planar shape corresponding to almost the entire area of the light transmittance areas TA.

In the patterned regions 275, the common electrode 270 may be completely removed. Thus, an opened region may be formed. The common electrode 270 may be partially removed in a thickness direction in a cross-sectional view such that the thickness may be thinner than that of the common electrode 270 formed in areas other than the patterned regions 275. That is, a thickness of the common electrode 270 corresponding to the light transmittance area TA may be less than the thickness of the common electrode 270 that corresponds to the pixel area PU2, or may be zero.

Accordingly, light transmittance in the light transmittance area TA may be higher than light transmittance in the pixel areas PU1 and PU2. Light transmittance in the light transmittance area TA may be high when light emitted from or incident on the optical member 500 that is disposed behind the display panel passes through the display panel. Accordingly, a recognition rate, sensing accuracy, or the like with respect to the object 600 to be recognized by the optical member 500 may be increased. In particular, when the common electrode 270 includes silver (Ag) and the optical member 500 includes an infrared camera, light transmittance of light in an infrared ray area may be more increased when the common electrode 270 in the second display area DA2 includes the patterned regions 275.

When the light transmittance areas TA and the pixel areas PU2 are arranged in a regular arrangement format in the second display area DA2, an image may be be displayed in the second display area DA2 as in the first display area DA1. The second display area Da2 may provide functions other than image displaying by using the optical member 500.

Resolution of the second display area DA2 may be lower than that of the first display area DA1. However, when the pixel areas PU2 and the light transmittance areas TA (i.e., the patterned regions 275 of the common electrode 270) are regularly alternately arranged in the second display area DA2, deterioration of quality of a displayed image may be prevented. For example, the pixel area PU2 of the second display area DA2 may include one red pixel R, one green pixel G, and one blue pixel B as shown in FIG. 13, FIG. 14, FIG. 15, and FIG. 17, and the pixel area PU2 may be substantially close to a square in shape. Accordingly, when such a pixel area PU2 is regularly alternately arranged with the light transmittance areas TA, light transmittance may be increased while preventing deterioration of image quality.

Referring to FIG. 5, in a plan view, a portion of the common electrode 270 disposed in the pixel areas PU2 surrounded by the light transmittance portions TA may be connected with the rest of the common electrode 270 through a bridge 70 included in the common electrode 270. The bridge 70 may prevent electrical disconnection therebetween. In the present exemplary embodiment, the bridge 70 may cross a boundary between two unit light transmittance areas TA, or may substantially extend in the first direction DR1 or the second direction DR2.

Portions of the common electrode 270, excluding the patterned regions 275 of the common electrode 270 in the second display area DA2, may be alternately arranged with the unit light transmittance areas TA in the first direction DR1 and the second direction DR2.

The common electrode 270 disposed in the second display area DA2 may include an edge portion 270a that is disposed at a side that does not neighbor the first display area DA1. In some implementations, the edge portion 270a may be omitted.

Figure 6:
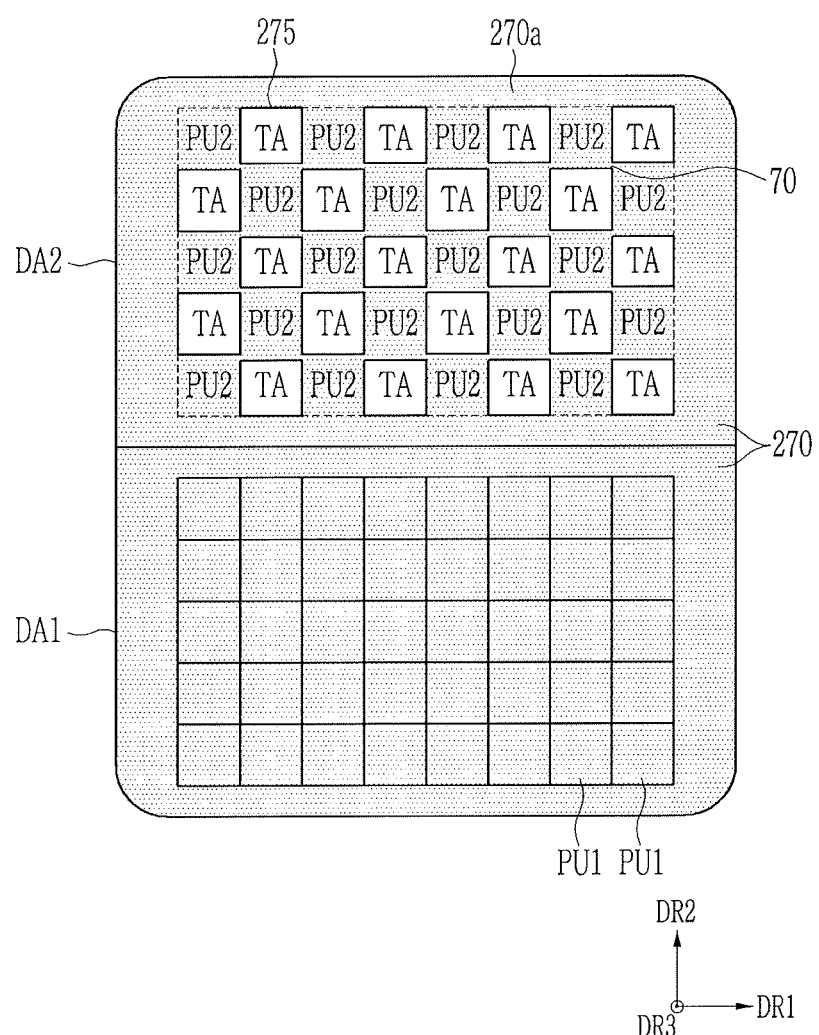

Referring to FIG. 6, a display device according to the present exemplary embodiment may be almost the same as the display device according to the exemplary embodiment shown in FIG. 5, except for a structure of a second display area DA2. The description will focus on the differences from the above-described embodiment, and the same description will not be repeated.

Light transmittance areas TA may be disposed between two pixel areas PU2 that neighbor each other in a first direction DR1 and a second direction DR2 in a second display area DA2. For example, the pixel areas PU2 and the light transmittance areas TA may be alternately arranged in the first direction DR1 and the second direction DR2. A plurality of pixel areas PU may neighbor each other in the diagonal direction.

In a plan view, a portion of the common electrode 270 disposed in the pixel areas PU2 surrounded by the light transmittance portions TA may be connected with the rest of the common electrode 270 through a bridge 70 included in the common electrode 270 to thereby prevent electrical disconnection therebetween. In the present exemplary embodiment, the bridge may connect two portions of the common electrode 270 that correspond to two pixel areas PU2 neighboring each other along one diagonal direction while crossing a boundary between two unit transmittance areas TA that neighbor each other along another diagonal direction.

In the second display area DA2, patterned regions 275 of the common electrode 270 may neighbor each other along a diagonal direction. Accordingly, portions excluding the patterned regions 275 of the common electrode 270 in the second display area DA2 may be alternately arranged with the unit light transmittance areas TA in the first direction DR1 and the second direction DR2 and may be arranged to neighbor each other in the diagonal directions. The unit light transmittance areas TA may not be disposed therebetween in the diagonal directions.

A size of one patterned region 275 may be the same as or similar to a size of one pixel area PU2.

Other features described with respect to the exemplary embodiment shown in FIG. 5 may be equally applied to the exemplary embodiment shown in FIG. 6.

Figure 7:
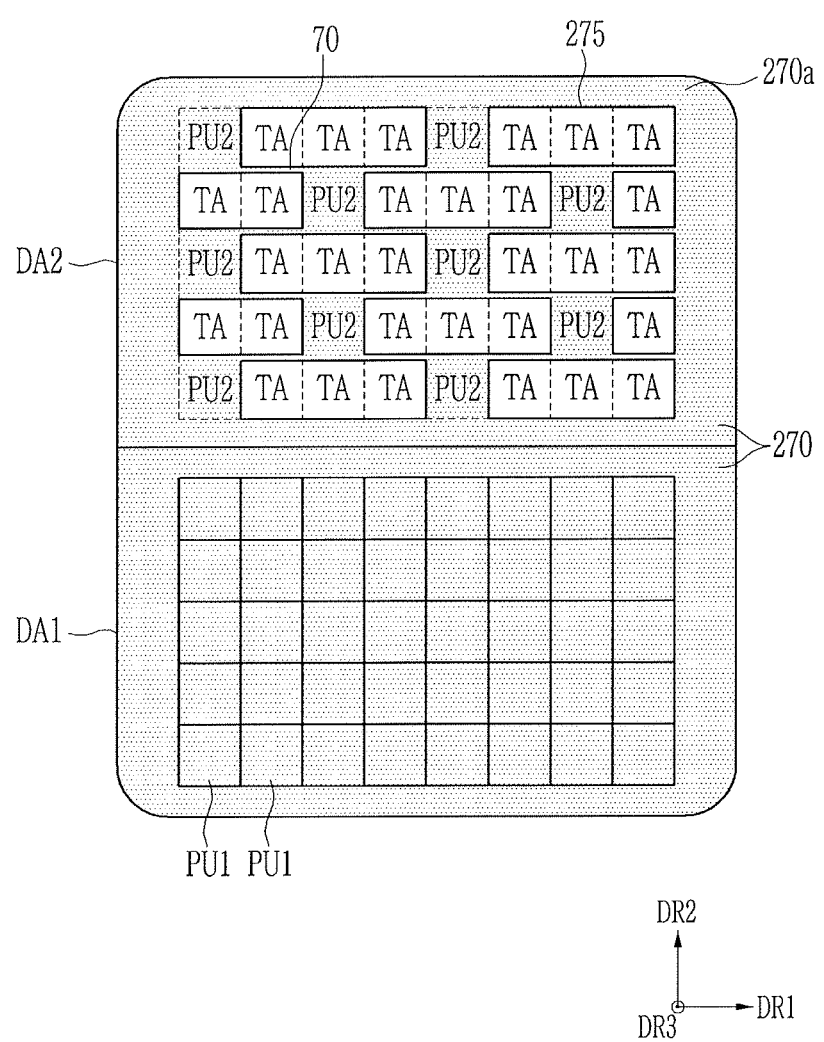

Referring to FIG. 7, a display device according to the present exemplary embodiment may be almost the same as the display device according to the exemplary embodiment shown in FIG. 5, except for a structure of a second display area DA2.

In the second display area DA2 shown in FIG. 7, pixel areas PU2 located in the third and fifth columns may be shifted one row down or one row up. For example, a plurality of pixel areas PU2 that are disposed in different neighboring columns may be arranged in a zigzagged format along the second direction DR2

Accordingly, three unit light transmittance areas TA may be disposed between two pixel areas PU2 that neighbor each other in the first direction DR1, and one unit light transmittance area TA may be disposed between two pixel areas PU2 that neighbor each other in the second direction DR2.

Portions excluding patterned regions 275 of a common electrode 270 in the second display area DA2 may be alternately arranged with three unit light transmittance areas TA in the first direction DR1, and may be alternately arranged with one unit light transmittance area TA in the second direction DR2.

The features of the above-described exemplary embodiments may be equally applied to the exemplary embodiment shown in FIG. 7

Figure 8:
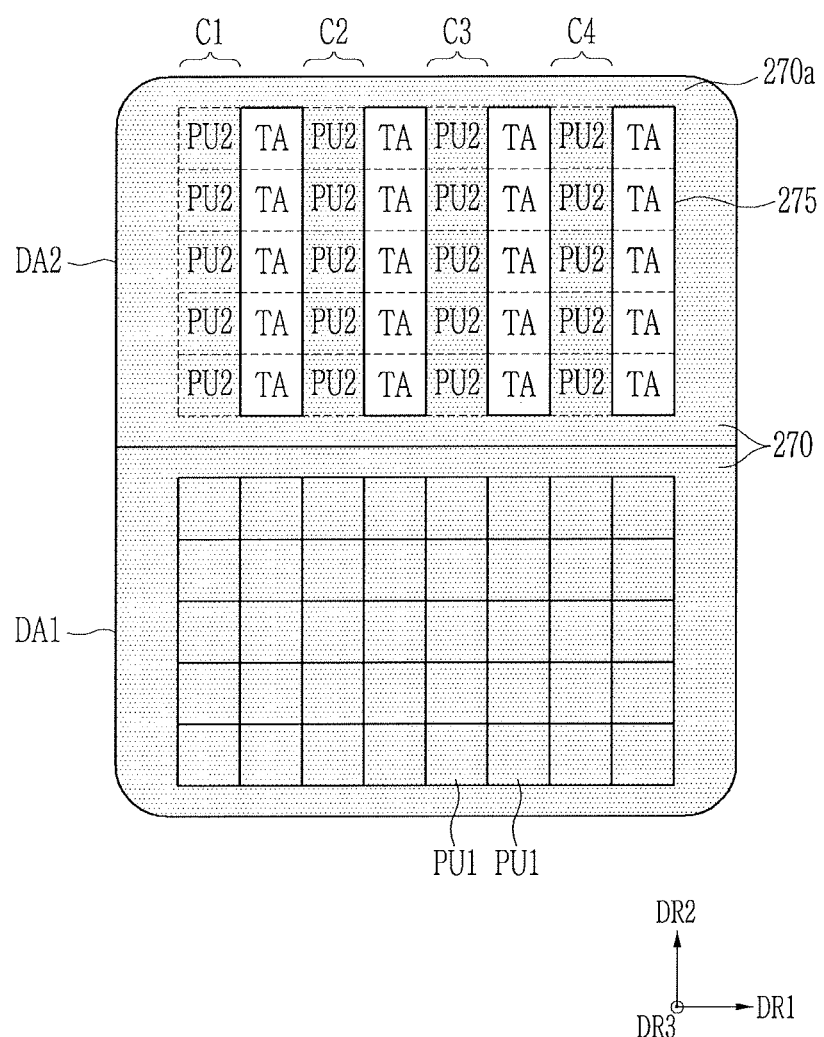

Referring to FIG. 8, a display device according to the present exemplary embodiment may be almost the same as the display device according to the exemplary embodiment shown in FIG. 5, except for a structure of a second display area DA2.

A plurality of pixel areas PU2 in the second display area DA2 may be arranged in a plurality of columns C1, C2, C3, and C4. A plurality of pixel areas PU2 arranged in the second direction DR2 may be located in each of the columns C1, C2, C3, and C4. A plurality of unit light transmittance areas TA arranged in the second direction DR2 or a light transmittance area TA that extends in the second direction DR2 may be located between two neighboring columns C1, C2, C3, and C4. A light transmittance area TA may not be located between two pixel areas PU2 that neighbor each other in the second direction DR2 in each of the columns C1, C2, C3, and C4. A plurality of pixel areas PU2 may be disposed adjacent a side (i.e., an area adjacent in the first direction DR1) of one continuous light transmittance area TA that extends in the second direction DR2.

Patterned regions 275 of a common electrode 270 may respectively extend in the second direction DR2 in the second display area DA2 and may correspond to the plurality of unit light transmittance areas TA that are arranged in the second direction DR2. Two patterned regions 275 that neighbor each other in the first direction DR1 may be separated from each other by as much as a length of at least one pixel area PU2 in the first direction DR1.

The features of the above-described exemplary embodiments may be equally applied to the exemplary embodiment shown in FIG. 8.

Figure 9:
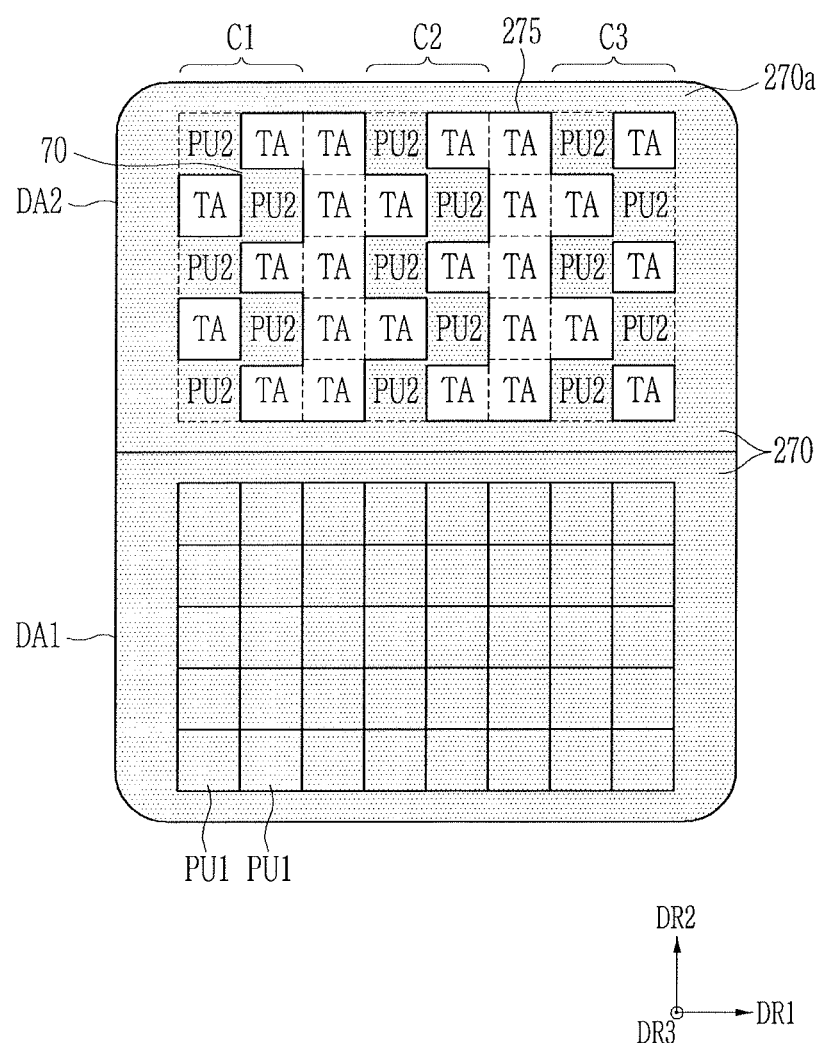

Referring to FIG. 9, a display device according to the present exemplary embodiment may be almost the same as the display device according to the exemplary embodiment shown in FIG. 8, except for a structure of a second display area DA2.

In second display area DA2, each of the plurality of columns C1, C2, and C3 may include a plurality of pixel areas PU2 that are arranged in a zigzag format in a second direction DR2, and a plurality of unit light transmittance areas TA. With respect to each of the columns C1, C2, and C3, a pair of one pixel area PU2 and one unit light transmittance area TA that neighbor each other sequentially in the first direction DR1, and a pair of one unit light transmittance area TA and one pixel area PU2 that neighbor each other sequentially in the first direction DR1, may be alternately arranged in the second direction DR2.

The plurality of unit light transmittance areas TA that are arranged in the second direction DR2 or one continuously light transmittance area TA that extends in the second direction DR2 may be disposed between two of neighboring columns C1, C2, and C3.

The features of the above-described embodiments may be equally applied to the embodiment shown in FIG. 9.

Figure 10:
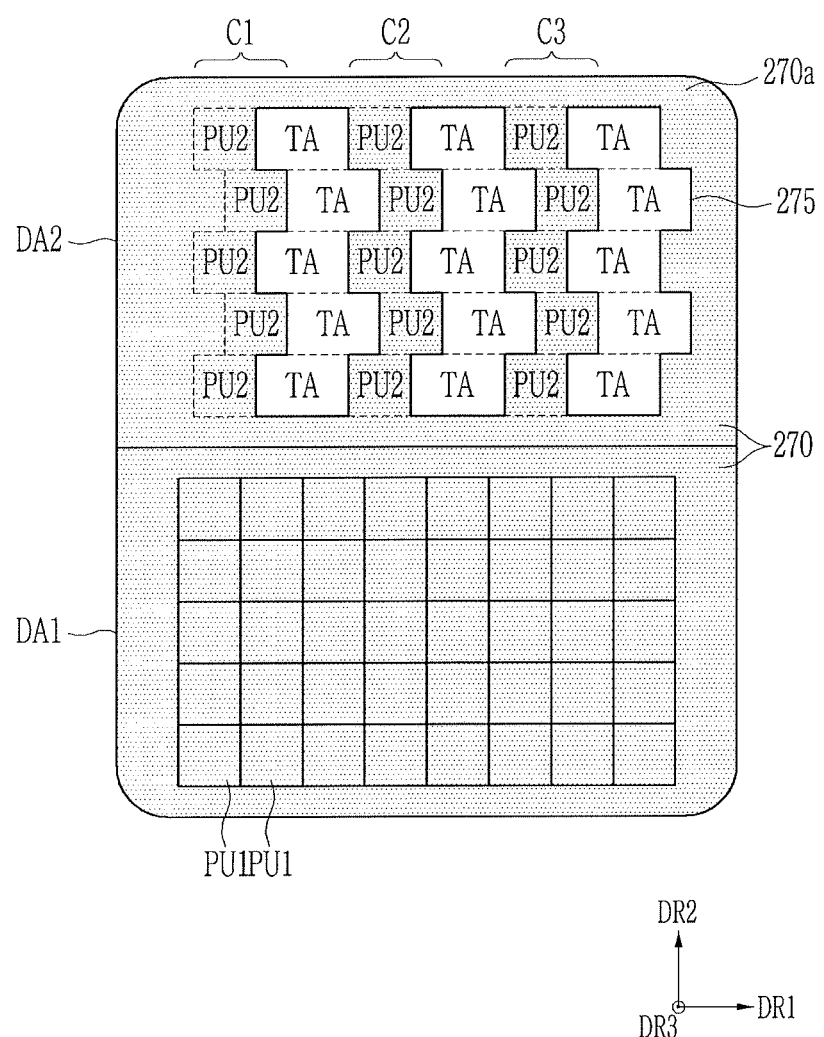

Next, referring to FIG. 10, a display device according to the present exemplary embodiment may be the same as the display device according to the exemplary embodiment shown in FIG. 9, except for a structure of a second display area DA2.

In a second display area DA2, a plurality of columns C1, C2, and C3 may respectively include a plurality of pixel areas PU2 that are arranged in a zigzag format in a second direction DR2. Two pixel areas PU2 that neighbor each other in the second direction DR2 may include a portion where the two pixels areas PU2 overlap with each other in the second direction DR2. For example, two pixel areas PU2 that are disposed in two rows that neighbor each other in each of the columns C1, C2, and C3 may share a part of edges thereof. Accordingly, a width of one column of C1, C2, and C3 may be smaller than a width of one column of C1, C2, and C3 of the exemplary embodiment shown in FIG. 9 in the first direction DR1.

A plurality of unit light transmittance areas TA that form one zigzag-shaped column may be disposed between two neighboring columns C1, C2, and C3. A plurality of unit light transmittance areas TA disposed in one column may be arranged in a zigzag format in a second direction DR2. Two unit light transmittance areas TA that neighbor each other in the second direction DR2 may include portions that overlap with each other in the second direction. Unit light transmittance areas TA that neighbor each other in the second direction DR2 in each column may share a part of edges.

Patterned regions 275 of the common electrode 270 respectively extend in the second direction DR2 and may correspond to the plurality of unit light transmittance areas TA arranged in the second direction DR2. Each of the patterned regions 275 may be alternately protruded to the left and right.

The features of the above-described embodiments may be equally applied to the embodiment shown in FIG. 10.

Figure 11:
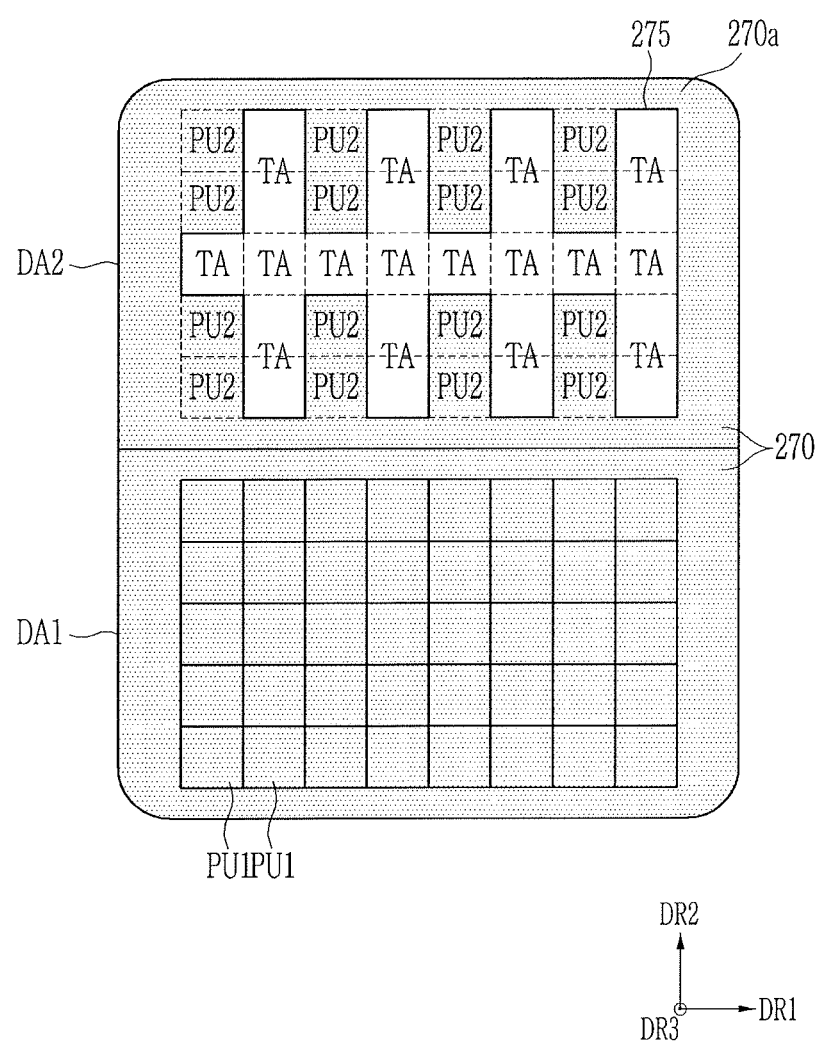

Referring to FIG. 11, a plurality of pixel areas PU2 that are adjacent to each other may form one group. A plurality of groups may be arranged in a first direction DR1 and a second direction DR2. Neighboring groups may be distanced from each other, with a light transmittance area TA disposed therebetween. FIG. 11 shows an example in which one group includes two pixel areas PU2 that are adjacent to each other in the second direction DR2.

In the second display area DA2, a patterned region 275 of a common electrode 270 may be disposed corresponding to light transmittance areas TA. The patterned region 275 may include a portion extending in the second direction DR2 and a portion extending in the first direction DR1. A bridge that is connected with pixel areas PU2 may be disposed in a middle of a portion of the light transmittance area TA and may extend in the first direction DR1, and/or a portion of the light transmittance area TA, and may extend in the second direction DR2.

The features of the above-described embodiments may be equally applied to the embodiment shown in FIG. 11.

Figure 12:
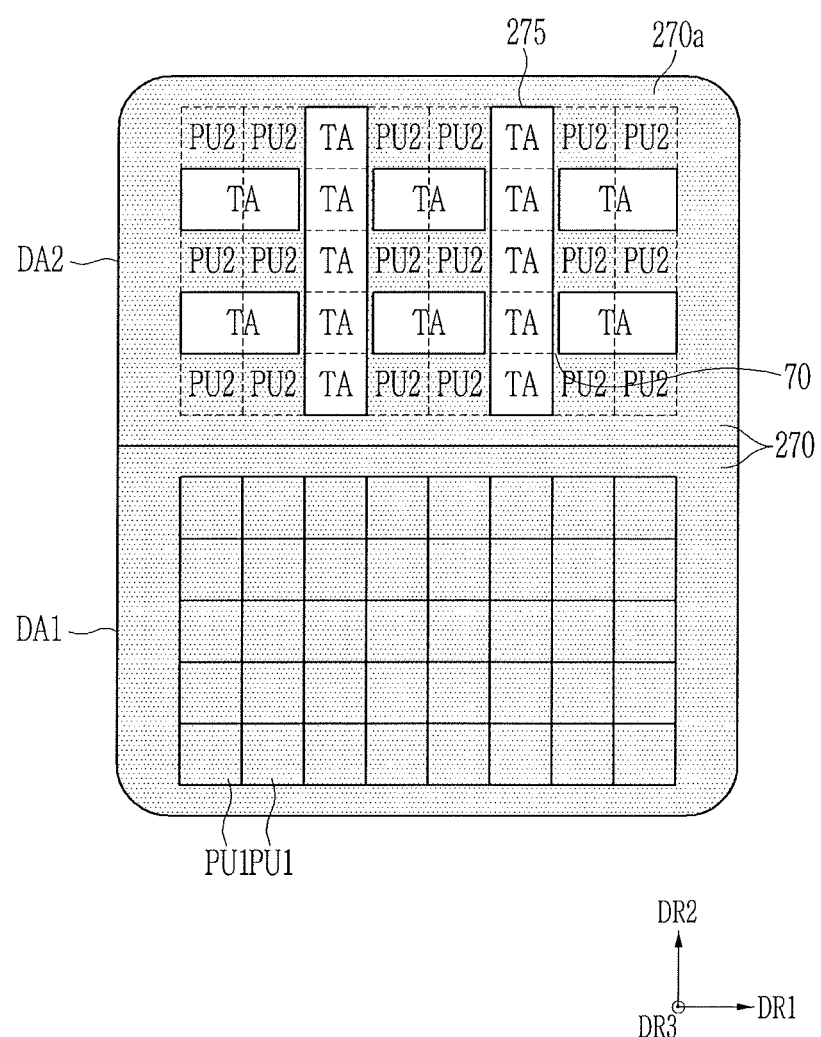

Referring to FIG. 12, a display device according to the present exemplary embodiment may be almost the same as the display device according to the exemplary embodiment shown in FIG. 11, except that one group includes two pixel areas PU2 that are adjacent to each other in a first direction DR1.

In a second display area DA2, a patterned region 275 of a common electrode 270 may be disposed corresponding to light transmittance areas TA. The patterned region 275 may include a portion extending in the second direction DR2 and a portion extending in the first direction DR1. A bridge that is connected with pixel areas PU2 may be disposed in a middle of a portion of the light transmittance area TA, and extending in the first direction DR1, and/or a portion of the light transmittance area TA, and extending in the second direction DR2.

The features of the above-described embodiments may be equally applied to the embodiment shown in FIG. 12

Hereinafter, examples of detailed structures of first and second display areas DA1 and DA2 of a display device according to an exemplary embodiment will be described with reference to FIG. 21 to FIG. 27, together with the above-described exemplary embodiments.

Figure 21:
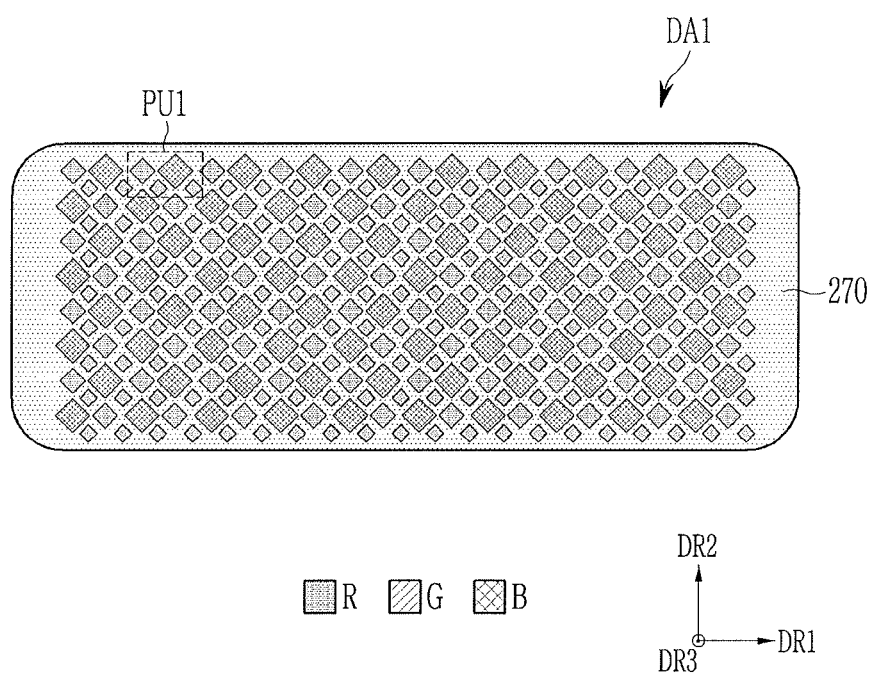
FIG. 21 and FIG. 22 illustrate layout views of a display area of a display device according to an exemplary embodiment.
Figure 22:
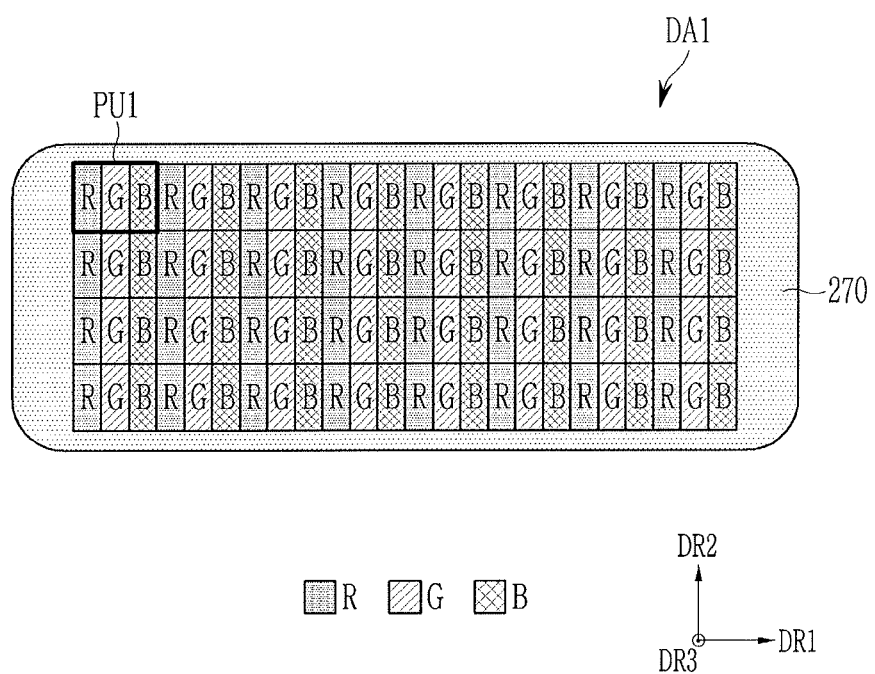
Figure 23:
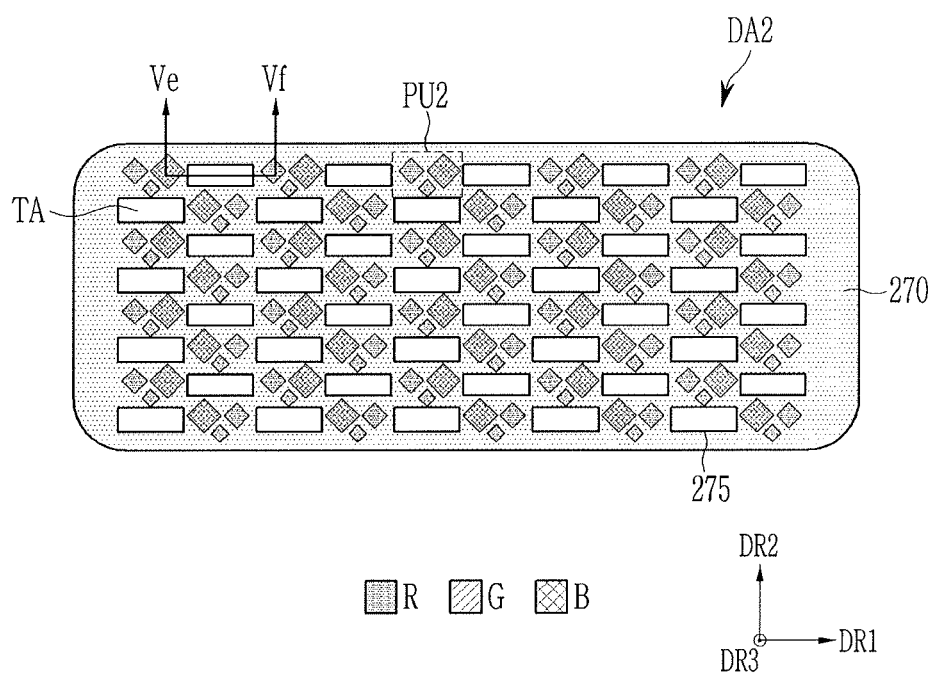
FIG. 23 illustrates a layout view of a display device according to an exemplary embodiment.
Figure 24:
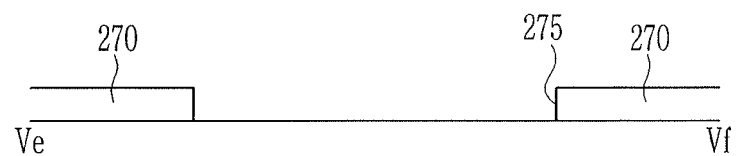
FIG. 24 and FIG. 25 illustrate cross-sectional views of the display device shown in FIG. 23, taken along the line Ve-Vf.
Figure 25:
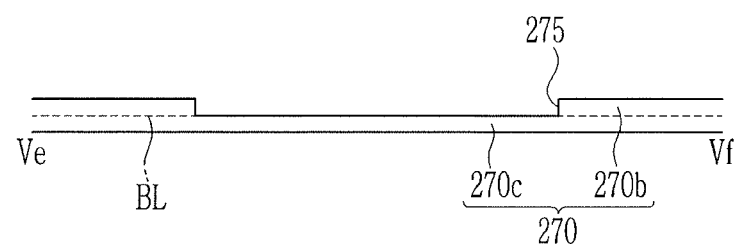
Figure 26:
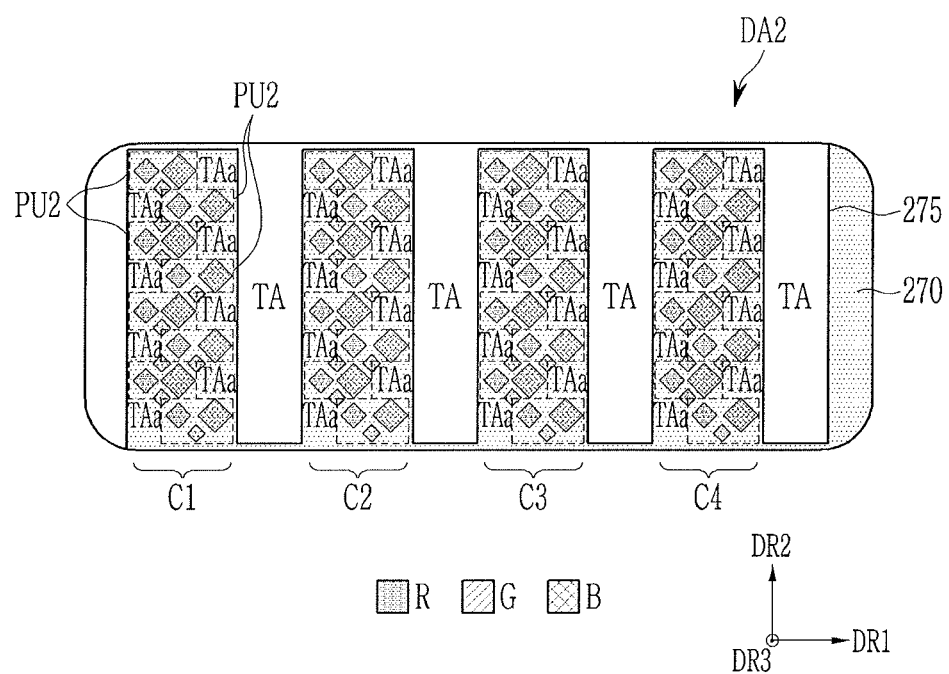
FIG. 26 and FIG. 27 illustrate layout views of a display area of a display device according to an exemplary embodiment.
Figure 27:
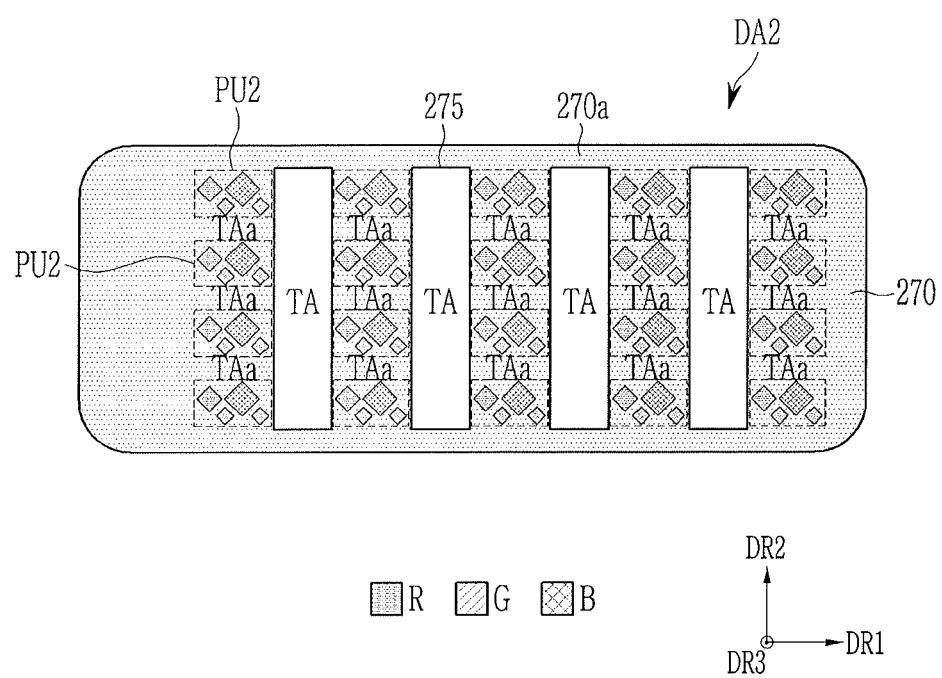

FIG. 21 and FIG. 22 are layout views of a display area of a display device according to an exemplary embodiment. FIG. 23 is a layout view of a display device according to an exemplary embodiment. FIG. 24 and FIG. 25 are cross-sectional views of the display device shown in FIG. 23, taken along the line Ve-Vf. FIG. 26 and FIG. 27 are layout views of a display area of a display device according to an exemplary embodiment.

Referring to FIG. 21, a part of a plurality of pixel areas PU1 included in a first display area DA1 of a display device according to an exemplary embodiment may be the pixel areas PUd in the above-described exemplary embodiment shown in FIG. 16. A part of the rest of the pixel areas PU1 may be the same as the pixel area PUf shown in FIG. 18. For example, the pixel areas PUd and the pixel areas PUf may be alternately arranged in the second direction DR2, or the pixel areas PUd may be iteratively arranged in the first direction DR1 and the pixel areas PUf may be iteratively arranged in the first direction DR1 in each row.

For example, red pixels R and blue pixels B may be alternately arranged in the first direction DR1 and the second direction DR2, the red pixels R and green pixels G may be alternately arranged in a diagonal direction, and the blue pixels B and the green pixels G are alternately arranged in another diagonal direction.

A common electrode 270 disposed in first display area DA1 may be formed as a single continuous electrode without having a cutout, an opening, or a pattern.

Referring to FIG. 22, a plurality of pixel areas PU1 included in the first display area DA1 of the display device according to the exemplary embodiment may be the same as the pixel areas PUa shown in FIG. 13. For example, the red pixels R may be arranged in the second direction DR2 in a pixel column that includes the red pixels R, the green pixels G may be arranged in the second direction DR2 in a pixel column that includes the green pixels G, and the blue pixels B may be arranged in the second direction DR2 in a pixel column that includes the blue pixels B. The pixel column that includes the red pixels R, the pixel column that includes the green pixels G, and the pixel column that includes the blue pixels B may be iteratively arranged.

A structure of the pixel area in the first display area DA1 may be variously modified.

Referring to FIG. 23 to FIG. 25, a part of a plurality of pixel areas PU2 included in a second display area DA of a display device according to an exemplary embodiment may be the same as the pixel areas PUc shown in FIG. 15. A part of the rest of the pixel areas PU2 may be the same as the pixel areas PUe shown in FIG. 17. An arrangement format of pixel areas PU2 and light transmittance areas TA in the second display area DA2 may be the same as the above-described exemplary embodiment shown in FIG. 6.

The pixel area PU2 may not be disposed in the light transmittance area TA. Patterned regions 275 of a common electrode 270 may be located correspondingly in at least a part of the light transmittance area TA. The plurality of light transmittance areas TA may be regularly arranged at a distance from each other in the second display area DA2.

FIG. 24 and FIG. 25 show a cross-sectional structure of the patterned region of the above-described common electrode 270 in detail. As shown in FIG. 24, the common electrode 270 may be completely removed in the patterned region 275. As shown in FIG. 25, a thickness of the common electrode 270 in the patterned region 275 may be thinner than a thickness of the remaining part of the common electrode 270.

In the exemplary embodiment shown in FIG. 25, the common electrode 270 may include a first layer 270c and a second layer 270b. The patterned region 275 includes only the first layer 270c. The common electrode 270, excluding the patterned region 275, may include both of the first layer 270c and the second layer 270b. The first layer 270c and the second layer 270b may have the same thickness or different thicknesses.

In a manufacturing process of such a common electrode 270, the first layer 270c may be formed first throughout the entire area of the first display area DA1 and the second display area DA2. Then, the second layer 270b may be patterned on the first layer 270c through various patterning processes. The patterned second layer 270b may be formed only in the common electrode 270, excluding the patterned region 275, and may not be formed in the patterned regions 275.

Next, referring to FIG. 26, a plurality of pixel areas PU2 included in a second display area DA2 of a display device according to an exemplary embodiment may be the same as the pixel areas PUc and PUe shown in FIG. 15 and FIG. 17. In addition, an arrangement format of the pixel areas PU2 of the second display area DA2 may be the same as in the above-described exemplary embodiment shown in FIG. 10.

Patterned regions 275 of a common electrode 270 may respectively extend in a second direction DR2. The plurality of patterned regions 275 may extend in a first direction DR1 at a distance from each other. The patterned regions 275 of the common electrode 270 may have an edge that matches an upper edge of the second display area DA2. Thus, in some implementations, the common electrode 270 may not be located at an outer side (e.g., an upper side) of one edge of each patterned region 275. For example, the common electrode 270 may not include the above-described edge portion 270a.

Green pixels G may be further located in an area where the pixel areas PU2 are formed in a zigzag pattern in the second direction DR2. The green pixels G may be disposed on a boundary between two pixel areas PU2 that are adjacent to each other in the second direction DR2.

Light transmittance areas TAa where pixels are not formed may be disposed between two pixel areas PU2 that neighbor each other in the second direction DR2. The light transmittance area TAa may be similar to the light transmittance area TA. The common electrode 270 may be formed in the light transmittance areas TAa.

Next, referring to FIG. 27, a plurality of pixel areas PU2 included in a second display area DA2 of a display device according to an exemplary embodiment may be the same as the pixel areas PUd and PUf shown in FIG. 16 and FIG. 18. An arrangement format of the pixel areas PU2 in the second display area DA2 may be the same as the above-described exemplary embodiment of FIG. 5.

Patterned regions 275 of a common electrode 270 may be almost the same as those according to the exemplary embodiment shown in FIG. 26, but an upper end edge of the patterned region 275 may not match an upper end edge of the second display area DA2. Thus, an edge portion 270a of the common electrode 270 may be located at an upper side of the upper edge of each of the patterned regions 275 on the plane.

Light transmittance areas TAa where no pixel is formed may be located between two pixel areas PU2 that neighbor each other in the second direction DR2. The light transmittance area TAa may be similar to the light transmittance area TA. However, the common electrode 270 may be formed in the light transmittance area TAa.

A structure of an example in which a display device according to an exemplary embodiment is provided as a light emission device will be described with reference to FIG. 28 and FIG. 29, together with the above-described drawings.

Figure 28:
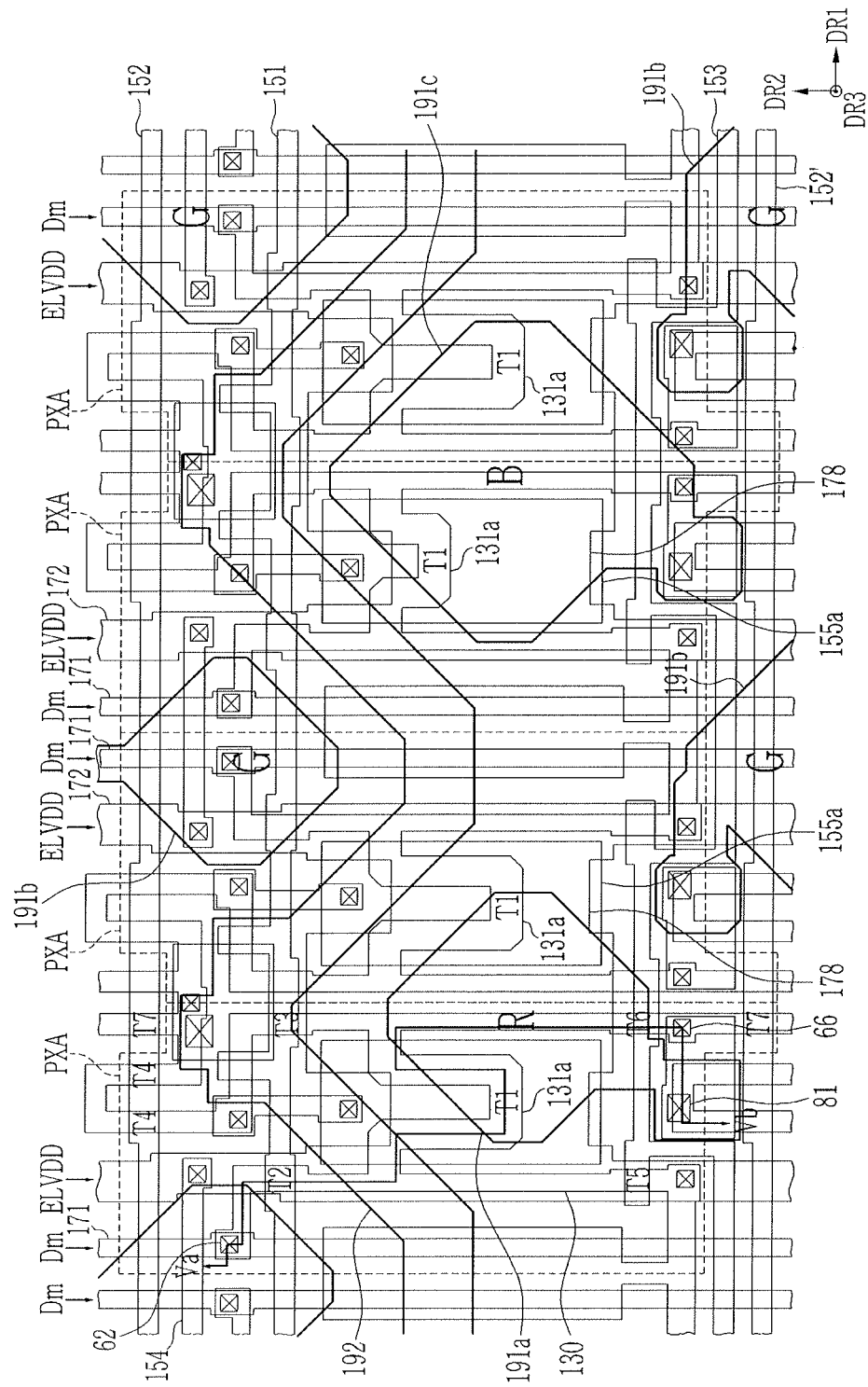
FIG. 28 illustrates a layout view of a display area of a display device according to an exemplary embodiment.
Figure 29:
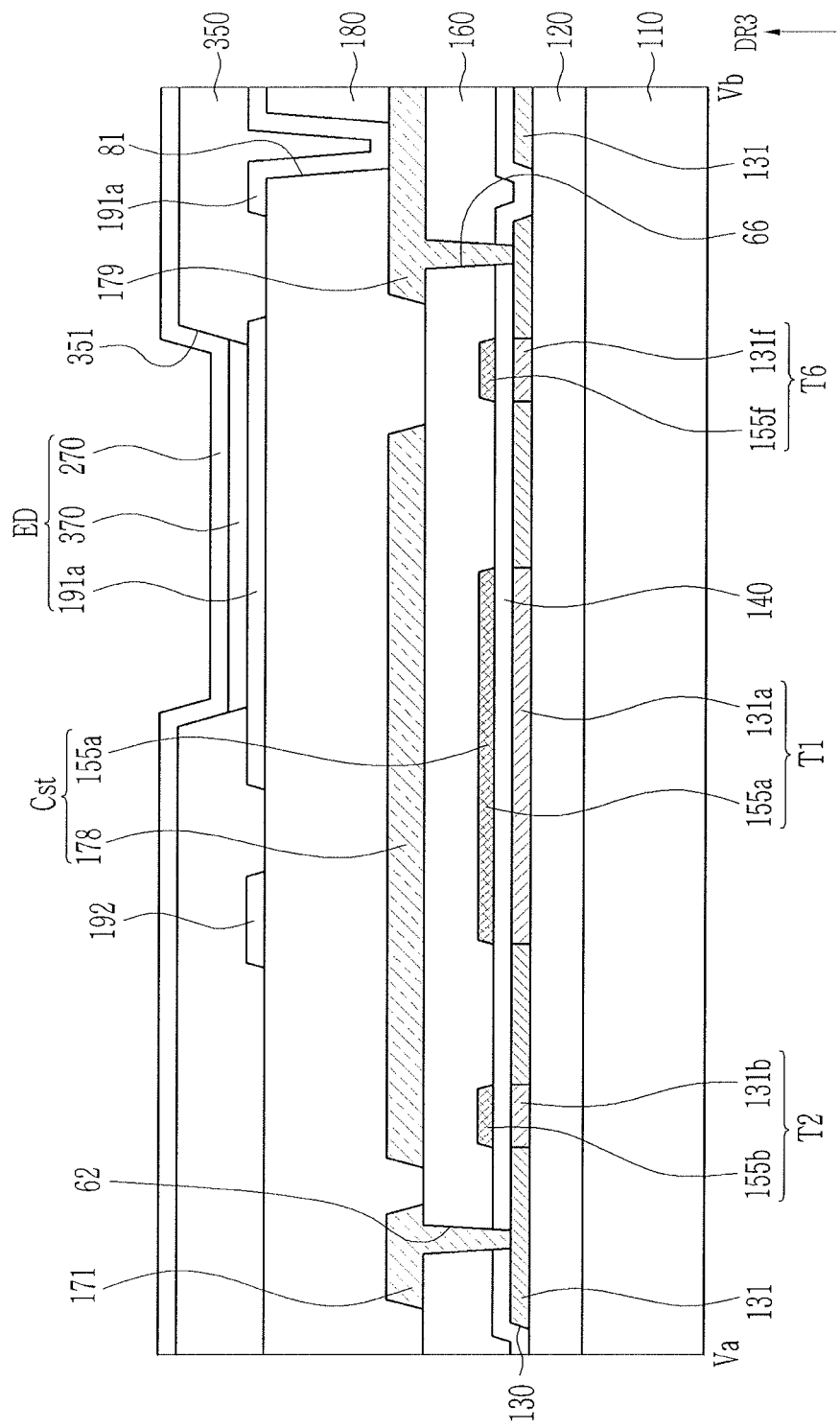
FIG. 29 illustrates a cross-sectional view of the display device shown in FIG. 28, taken along the line Va-Vb.

FIG. 28 illustrates a layout view of a display area of a display device according to an exemplary embodiment, and FIG. 29 illustrates a cross-sectional view of the display device shown in FIG. 28, taken along the line Va-Vb.

Referring to FIG. 28, a display device according to an exemplary embodiment may include a plurality of pixel circuit areas PXA where pixel circuits are formed corresponding to a plurality of pixels R, G, and B. The plurality of pixel circuit areas PXA may be arranged in a matrix formed in a first direction DR1 and a second direction DR2.

Each pixel circuit area PXA may include a plurality of transistors T1, T2, T3, T4, T5, T6, and T7 that are connected with a plurality of scan lines 151, 152, and 152', a control line 153, a data line 171, and a driving voltage line 172.

The plurality of scan lines 151, 152, and 152' may transmit a scan signal. The scan line 152 may transmit a scan signal of a previous stage, and the scan line 152' may transmit a scan signal of the next stage. The control line 153 may transmit a control signal. For example, the control line 153 may transmit a light emission control signal to control the emission of light emitting diodes corresponding to the pixels R, G, and B.

The data line 171 may transmit a data signal Dm. The driving voltage line 172 may transmit a driving voltage ELVDD. The driving voltage line 172 may include a plurality of expansion portions 178 that protrude toward the first direction DR1.

A channel of each of the plurality of transistors T1, T2, T3, T4, T5, T6, and T7 may be formed in an active pattern 130. The active pattern 130 may be bent in various shapes and may include amorphous/polycrystalline silicon or a semiconductor material such as an oxide semiconductor. For example, the transistor T1 may include a channel region 131a of the active pattern 130 that is bent at least once.

A display device according to an exemplary embodiment may include a plurality of pixel electrodes 191a, 191b, and 191c that correspond to the respective pixel circuit areas PXA, and a voltage line 192. The pixel electrodes 191a, 191b, and 191c may be respectively disposed corresponding to the pixels R, G, and B. The pixel electrode 191a of the red pixel R may be smaller than the pixel electrode 191c of the blue pixel B, and the pixel electrode 191b of the green pixel G may be smaller than the pixel electrode 191a of the red pixel R.

The voltage line 192 may be bent along the periphery of edges of the adjacent pixel electrodes 191a, 191b, and 191c. The voltage line 192 may transmit a constant voltage such as an initialization voltage to initialize one node in the pixel circuit area PXA.

A cross-sectional structure of the display device according to the exemplary embodiment will be described with reference to FIG. 29, together with FIG. 28.

The display device according to the exemplary embodiment may include a substrate 110.

A buffer layer 120, which is an insulation layer, may be on the substrate 110. The active pattern 130 may be on the buffer layer 120. The active pattern 130 may include channel regions 131a, 131b, and 131f, and a conductive region 131. A conductive region 131 may be at opposite sides of each of the channel regions 131a, 131b, and 131f. The conductive region 131 may become a source region and a drain region, respectively, of the corresponding transistor.

A gate insulation layer 140 may be on the active pattern 130.

A first conductive layer that includes the plurality of scan lines 151, 152, and 152', the control line 153, and a driving gate electrode 155a may be disposed on the gate insulation layer 140.

An interlayer insulation layer 160 may be on the first conductive layer and the gate insulation layer 140.

At least one of the buffer layer 120, the gate insulation layer 140, and the interlayer insulation layer 160 may include an inorganic insulation material e.g., a silicon nitride, a silicon oxide, a silicon oxynitride, or the like, or an organic insulation material.

The interlayer insulation layer 160 and the gate insulation layer 140 may include a contact hole 62 extending through a source region connected to the channel region 131b of the transistor T2 in the conductive area 131 of the active pattern 130 and a contact hole 66 that extends through a drain region connected to the channel region 131f of the transistor T6 in the conductive area 131 of the active pattern 130.

A second conductive layer that includes the data line 171, the driving voltage line 172, and a connecting member 179 may be disposed on the interlayer insulation layer 160.

The data line 171 may be connected with a source region connected to the channel region 131b of the transistor T2 through the contact hole 62. The expansion portion 178 of the driving voltage line 172 may form a capacitor Cst by overlapping the driving gate electrode 155a, while disposing the interlayer insulation layer 160 therebetween. The connecting member 179 may be connected with a drain region connected to the channel region 131f of the transistor T6 through the contact hole 66.

At least one of the first conductive layer and the second conductive layer may include a metal, e.g., copper (Cu), aluminum (Al), molybdenum (Mo), titanium (Ti), tantalum (Ta), or an alloy of at least two of these.

A passivation layer 180 may be on the second conductive layer and the interlayer insulation layer 160. The passivation layer 180 may include an organic insulation material such as a poly-acrylic resin, a polyimide resin, or the like, and may have a substantially flat top surface. The passivation layer 180 may include a contact hole 81 that extends through on the connecting member 179.

A third conductive layer that includes the pixel electrodes 191a, 191b, and 191c and the voltage line 192 may be on the passivation layer 180. Each of the pixel electrodes 191a, 191b, and 191c may be connected with the connecting member 179 through the contact hole 81. The third conductive layer may include a semi-transmissive conductive material or a reflective conductive material.

An insulation layer 350 may be on the third conductive layer. The insulation layer 350 may include an organic insulation material and may include an opening 351 that exposes the respective pixel electrodes 191a, 191b, and 191c.

An emission layer 370 may be on the pixel electrodes 191a, 191b, and 191c. The emission layer 370 may include a portion inside the opening 351, and a portion on the insulation layer 350. The emission layer 370 may include an organic light emitting material or an inorganic light emitting material.

A common electrode 270 may be on the emission layer 370 and the insulation layer 350. The common electrode 270 may also be formed on the insulation layer 350. The common electrode 270 may include a conductive transparent material. The common electrode 270 may include silver (Ag).

A common layer such as a hole injection layer, a hole transfer layer, an electron injection layer, an electron transfer layer, and the like may be disposed between the insulation layer 350 and the common electrode 270, between the emission layer 370 and the common electrode 270, and/or between the emission layer 370 and the pixel electrodes 191a, 191b, and 191c. The common layer may be formed through the first display area DA1 and the second display area DA2.

Each of the pixel electrodes 191a, 191b, and 191c, the emission layer 370, and the common electrode 270 may form an emitting diode ED, which is an emitting element. The common electrode 270 may form a cathode and the pixel electrodes 191a, 191b, and 191c may form an anode, or vice versa.

The first display area DA1 may have a structure that is the same as shown in FIG. 28 and FIG. 29.

A planar structure and a cross-sectional structure of a pixel area PU2 of the second display area DA2 may have a structure that is a part of the structure shown in FIG. 28 and the structure shown in FIG. 29.

In a light transmittance area TA of the second display area DA2, the common electrode 270 may be removed in a pattern area 275 as shown in FIG. 24 or may be more thinly stacked than at the periphery thereof as shown in FIG. 25.

In the light transmittance area TA, at least a part of the structures shown in FIG. 28 and FIG. 29, for example, at least some of the active pattern 130, the driving gate electrode 155a, the expansion portion 178 of the driving voltage line 172, the pixel electrodes 191a, 191b, and 191c, and the emission layer 370, may be removed. Accordingly, light transmittance in the light transmittance area TA may be higher than light transmittance in pixel areas PU1 and PU2.

A structure of a display device, which is exemplarily provided as a liquid crystal display, according to an exemplary embodiment will be described with reference to FIG. 30 and FIG. 31, together with the above-described drawings.

Figure 30:
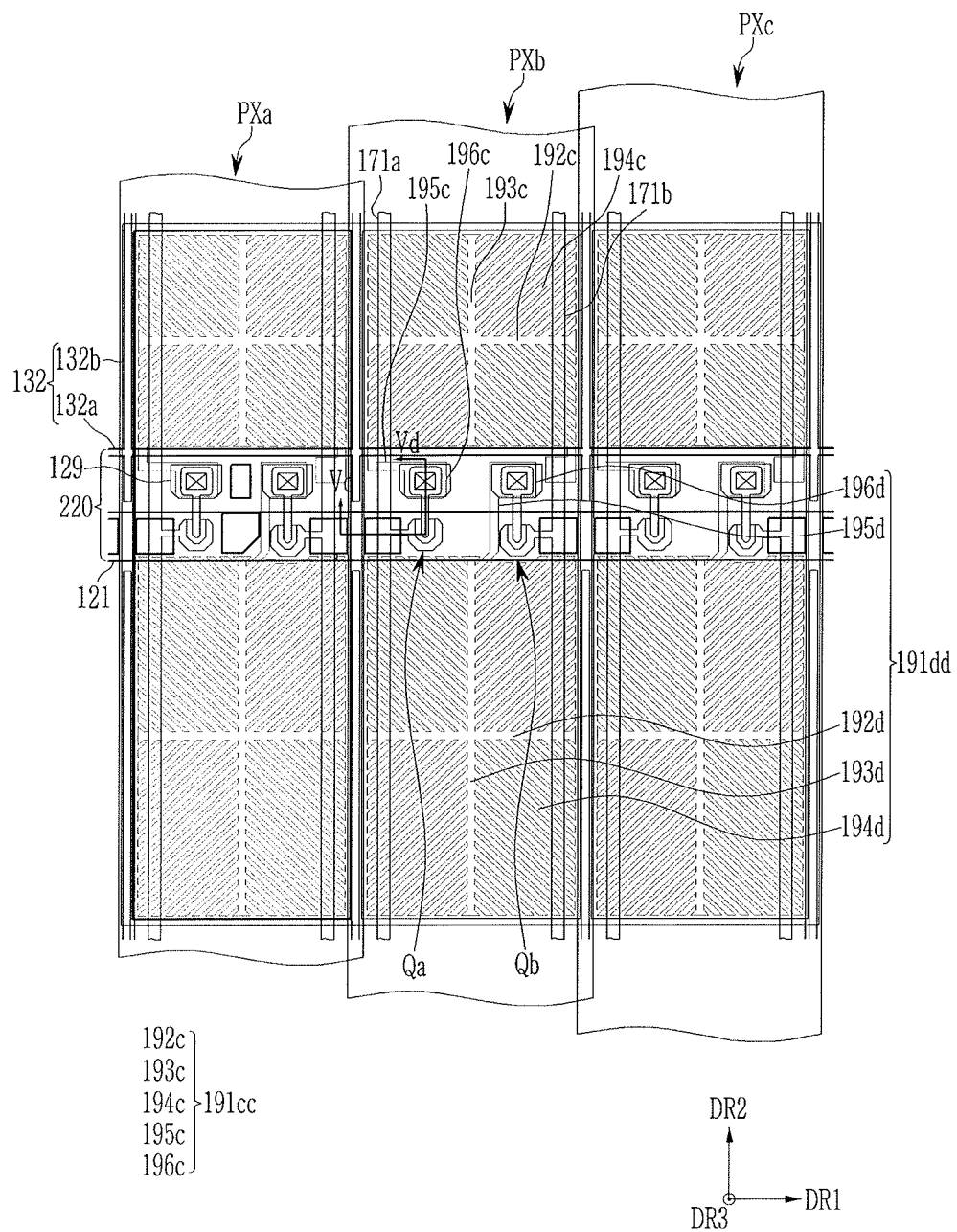
FIG. 30 illustrates a layout view of three adjacent pixels in a display device according to an exemplary embodiment.
Figure 31:
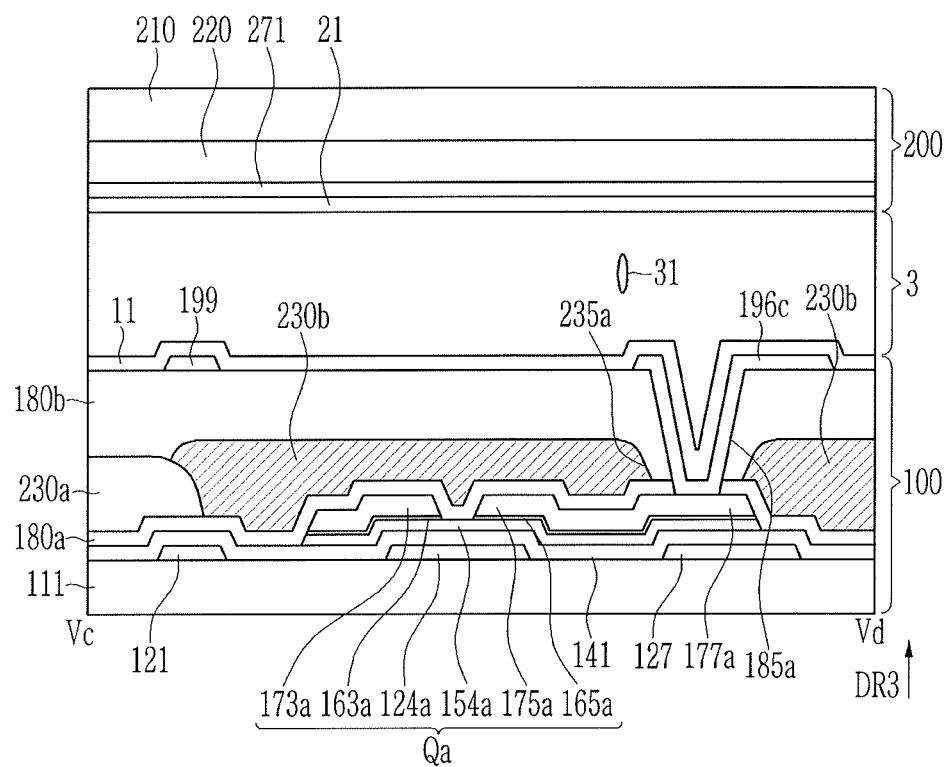
FIG. 31 illustrates a cross-sectional view of the display device shown in FIG. 30, taken along the line Vc-Vd.

FIG. 30 is a layout view of three adjacent pixels in a display device according to an exemplary embodiment, and FIG. 31 is a cross-sectional view of the display device shown in FIG. 30, taken along the line Vc-Vd.

As a liquid crystal display, a display device according to an exemplary embodiment may include a first display panel 100, a second display panel 200, and a liquid crystal layer 3 disposed between the two display panels 100 and 200 in a plan view.

The above-described first display area DA1 may include a plurality of pixels PXa, PXb, and PXc. The plurality of pixels PXa, PXb, and PXc may be iteratively arranged in a first direction DR1 and a second direction DR2.

The first display panel 100 may include a gate conductive layer that includes gate lines 121, storage electrode lines 132, dummy patterns 129, and the like, on the substrate 110.

The gate line 121 extends substantially in the first direction DR1. The gate line 121 may transmit a gate signal. The gate line 121 may include a first gate electrode 124a and a second gate electrode that are disposed in each of the pixels PXa, PXb, and PXc.

The storage electrode line 132 may include a horizontal portion 132a that extends substantially in parallel with the gate line 121, and a vertical portion 132b that is connected to the horizontal line 132a. The vertical portion 132b of the storage electrode line 132 may extend along a boundary between two adjacent pixels of PXa, PXb, and PXc.

The dummy pattern 129 may be between the horizontal portion 132a of the adjacent storage electrode line 132 and the gate line 121. Each dummy pattern 129 may have an island-like shape.

A gate insulation layer 141 may be on the gate conductive layer. A semiconductor layer that includes a first semiconductor 154a and a second semiconductor may be disposed on the gate insulation layer 141. The first semiconductor 154a may overlap a first gate electrode 124a, and the second semiconductor may overlap a second gate electrode. The semiconductor layer may include amorphous silicon, polysilicon, or a metal oxide.

Ohmic contact members 163a and 165a may be disposed on the semiconductor layer.

A plurality of data lines that include a first data line 171a and a second data line 171b, and a data conductor layer that includes a plurality of first drain electrodes 175a and a plurality of second drain electrodes may be on the ohmic contact members 163a and 165a.

The first data line 171a may include a first source electrode 173a that overlaps the first gate electrode 124a, and the second data line 171b may include a second source electrode that overlaps the second gate electrode.

The first drain electrode 175a and the second drain electrode may each include a bar-shaped end portion and an expansion portion 177a, which is a wide end portion. Each drain electrode 175a may overlap the dummy pattern 129 of the gate conductive layer.

The first gate electrode 124a, the first source electrode 173a, and the first drain electrode 175a form a first transistor Qa together with the first semiconductor 154a, and the second gate electrode, the second source electrode, and the second drain electrode form a second transistor Qb together with the second semiconductor. The first and second transistors Qa and Qb may function as switches that transmit a data voltage transmitted by the first and second data lines 171a and 171b according to a gate signal transmitted by the gate line 121.

An area where the gate line 121, the horizontal portion 132a of the storage electrode line 132, and the first and second transistors Qa and Qb are disposed may be covered by a light blocking member 220. The light blocking member 220 may extend substantially in the first direction DR1 and thus may form a light blocking area of each of the pixels PXa, PXb, and PXc.

A first insulation layer 180a may be on the data conductive layer. The first insulation layer 180a may include an organic insulating material or an inorganic insulating material.

A plurality of color filters 230a and 230b may be on the first insulation layer 180a. Each of the color filters 230a and 230b may include an opening 235a that overlaps the expansion portion 177a of the first and second drain electrodes 175a.

A second insulation layer 180b may be on the color filters 230a and 230b. The second insulation layer 180b may include an inorganic insulating material or an organic insulating material, and specifically includes an organic insulating material and thus may substantially have a flat top surface.

The first insulation layer 180a and the second insulation layer 180b may include a contact hole 185a on the expansion portion 177a of the first drain electrode 175a, and a contact hole on an expansion portion of the second drain electrode.

A pixel electrode that includes a plurality of first sub-pixel electrodes 191cc and a plurality of second sub-pixel electrodes 191dd, and a pixel electrode layer that includes a shield electrode 199 may be on the second insulation layer 180b.

The overall shape of each of the first and second sub-pixel electrodes 191aa and 191dd may be quadrangular. Each first sub-pixel electrode 191cc may include a cross-shaped stem portion that includes a horizontal stem 192c and a vertical stem 193c, and a plurality of branch portions 194c that extend to the outside from the cross-shaped stem portion. Each second sub-pixel electrode 191dd may include a cross-shaped stem portion that includes a horizontal stem 192d and a vertical stem 193d, and a plurality of branch portions 194d that extend to the outside from the cross-shaped stem portion.

The first sub-pixel electrode 191cc may include an extension portion 195c that protrudes toward the expansion portion 177a of the first drain electrode 175a and a contact portion 196c that is connected to the end of the extension portion 195c, and the second sub-pixel electrode 191dd may include an extension portion 195d that protrudes toward the expansion portion of the second drain electrode and a contact portion 196d that is connected to the end of the extension portion 195d. The contact portion 196c is electrically connected with the expansion portion 177a of the first drain electrode 175a through the contact hole 185a, and the contact portion 196d is electrically connected with the expansion portion of the second drain electrode through a contact hole.

The shield electrode 199 may extend between pixels PXa, PXb, and PXc adjacent to each other in the first direction DR1 and/or pixels PXa, PXb, and PXc adjacent to each other in the second direction DR2 to prevent coupling and light leakage between the adjacent pixels PXa, PXb, and PXc.

The pixel electrode layer may include a transparent conductive material, e.g., indium-tin oxide (ITO), indium-zinc oxide (IZO), a metal thin film, or the like.

An alignment layer 11 may be coated on the pixel electrode layer and the second insulation layer 180b.

Next, in the second display panel 200, the light blocking member 220 may be on a substrate 210 (in FIG. 31, below the substrate 210). A common electrode 271 may be on the light blocking member 220 (in FIG. 32, below the light blocking member 220). The common electrode 271 may be formed on the entire surface of the substrate 210. The common electrode 271 may transmit a common voltage. The common electrode 271 may include a transparent conductive material such as ITO, IZO, a metal thin film, or the like.

An alignment layer 21 may be coated on the common electrode 271 (in FIG. 31, below the common electrode 271).

The liquid crystal layer 3 may include a plurality of liquid crystal molecules 31.

The previously described first display area DA1 may have a structure shown in FIG. 30 and FIG. 31.

A planar structure and a cross-sectional structure of the pixel area PU2 of the second display area DA2 may have a part of the structure shown in FIG. 30 and the structure shown in FIG. 31.

In the light transmittance area TA of the second display area DA2, the common electrode 271 may have a pattern area 275 like the above-described common electrode 270. In the pattern area 275, the common electrode 271 may be removed as shown in FIG. 24 or may be stacked thinner than at the periphery, as shown in FIG. 25.

In the light transmittance area TA, at least a part of the structure shown in FIG. 30 and FIG. 31, for example, at least a part of the semiconductor layer, the gate electrode 124a, the drain electrode 175a, and the sub-pixel electrodes 191cc and 191dd may be removed. Accordingly, light transmittance in the light transmittance area TA may be higher than that of the pixel areas PU1 and PU2. The substrate 110 in the light transmittance area TA may not be removed.

By way of summation and review, a display device may include functions in addition to a function of displaying an image. When a display device includes an optical member, it is desirable to increase light transmittance in a display area corresponding to the optical member and prevent deterioration of the display quality of a displayed image.

Embodiments provide a display device that includes an optical member, and in which light transmittance in a display area corresponding to the optical member is increased and deterioration of the display quality of a displayed image is minimized or prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a substrate that includes a first display area, and a second display area adjacent to the first display area, the first display area including a plurality of first pixels arranged in a first direction and a second direction perpendicular to the first direction, and the second display area including a plurality of second pixels; arranged in the first direction and the second direction, wherein
    each of the first pixels and the second pixels comprises:
    at least one transistor formed on the substrate;
    a pixel electrode on the at least one transistor;
    an emission layer on the pixel electrode; and
    a common electrode on the emission layer and transmitting a common voltage,
    the common electrode disposed in the second display area has at least one opening where the common electrode is not present, the at least one opening disposed between adjacent pixels of the plurality of second pixels in the first direction or the second direction, and
    the common electrode disposed in the first display area is continuously formed over all of the plurality of first pixels arranged in the first direction and the second direction.

2. The display device as claimed in claim 1, wherein the common electrode disposed in the second display area has a plurality of the openings,
    the pixel electrode, the emission layer, and the common electrode that overlap each other in the second pixel form a light emitting diode, and
    the light emitting diode and the openings of the common electrode are alternately arranged in the first direction in the second display area.

3. The display device as claimed in claim 2, wherein, in the second display area, the light emitting diode and the openings of the common electrode are also alternately arranged in the second direction.

4. The display device as claimed in claim 2, wherein the plurality of second pixels comprises a first color pixel representing a first color, a second color pixel representing a second color that is different from the first color, and a third color pixel representing a third color that is different from the first color and the second color.

5. The display device as claimed in claim 4, wherein the first color pixel, the second color pixel, and the third color pixel are formed in a same shape as each other and are adjacently arranged in a line.

6. The display device as claimed in claim 4, wherein at least two of the first color pixel, the second color pixel, and the third color pixel are different in size from each other.

7. The display device as claimed in claim 2, wherein at least one opening of the plurality of openings extends along in the second direction.

8. A display device, comprising:
    a substrate that includes a first display area and a second display area, the first display area including a plurality of first pixels arranged in a first direction and a second direction perpendicular to the first direction, and the second display area including a plurality of second pixels arranged in the first direction and the second direction, wherein
    each of the first pixels and the second pixels comprises:
    at least one transistor formed on the substrate;
    a pixel electrode on the at least one transistor;
    an emission layer on the pixel electrode; and
    a common electrode on the emission layer and transmitting a common voltage, wherein
    the common electrode disposed in the second display area is continuously formed over the plurality of second pixels, has at least one patterned region, not overlapping any pixel of the plurality of second pixels, and
    a thickness of the common electrode in the patterned region is smaller than a thickness of the common electrode in a region other than the patterned region.

9. The display device as claimed in claim 8, wherein the common electrode in the first display area is continuously formed with a uniform thickness over all of the plurality of first pixels arranged in the first direction and the second direction.

10. The display device as claimed in claim 8, wherein
    the common electrode disposed in the second display area has a plurality of the patterned regions,
    the pixel electrode, the emission layer and the common electrode that overlap each in the second pixel form a light emitting diode, and
    the light emitting diode and the patterned regions of the common electrode are alternately arranged in first direction in the second display area.

11. The display device as claimed in claim 10, wherein, in the second display area, the light emitting diode and the patterned regions of the common electrode are also alternately arranged in the second direction.

12. The display device as claimed in claim 10, wherein the plurality of second pixels comprises a first color pixel representing a first color, a second color pixel representing a second color that is different from the first color, and a third color pixel representing a third color that is different from the first color and the second color.

13. The display device as claimed in claim 12, wherein the first color pixel, the second color pixel, and the third color pixel are formed in a same shape as each other and are adjacently arranged in a line.

14. The display device as claimed in claim 12, wherein at least two of the first color pixel, the second color pixel, and the third color pixel are different in size from each other.

15. The display device as claimed in claim 10, wherein one of the at least one patterned region extends along in the second direction.

16. The display device as claimed in claim 8, wherein the at least one patterned region has varying light transmittance.

17. The display device as claimed in claim 8, wherein the thickness of the common electrode over each pixel of the first pixels and the second pixels is substantially uniform.

* * * * *